(12) United States Patent
Bergemont

(10) Patent No.: US 6,482,723 B1
(45) Date of Patent: Nov. 19, 2002

(54) METHOD FOR FORMING SELF-ALIGNED FLOATING GATES

(75) Inventor: Albert Bergemont, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 67 days.

(21) Appl. No.: 09/666,810

(22) Filed: Sep. 21, 2000

(51) Int. Cl.$^7$ .................... H01L 21/04; H01L 21/336
(52) U.S. Cl. ............... 438/510; 438/261; 438/192; 438/588; 438/657; 438/787
(58) Field of Search ................ 438/510, 593, 438/296, 266, 231, 257, 275, 279, 589, 594, 192, 258, 264, 259, 520, 787, 657, 588, 261, 263, 262, 241

(56) References Cited

U.S. PATENT DOCUMENTS

| | | | |
|---|---|---|---|
| 5,856,222 A | 1/1999 | Bergemont et al. | 438/258 |
| 5,889,700 A | 3/1999 | Bergemont et al. | 365/185.18 |
| 6,251,728 B1 * | 6/2001 | Patelmo et al. | 438/257 |
| 6,281,103 B1 * | 8/2001 | Doan | 438/593 |

* cited by examiner

*Primary Examiner*—Matthew Smith
*Assistant Examiner*—Igwe U. Anya
(74) *Attorney, Agent, or Firm*—Mark C. Pickering

(57) ABSTRACT

Self-aligned floating gates are formed to have precisely defined lengths and positions. The floating gates are formed by first forming a number of shallow trench isolation regions that have substantially planar top surfaces that lie above the top surface of the semiconductor material. A layer of dielectric is formed on the semiconductor material, followed by the formation of a first layer of polysilicon. The first layer of polysilicon is then planarized so that the first layer of polysilicon is removed from the isolation regions. In subsequent steps, the polysilicon is again etched to form the floating gates. As a result of the planarization, the lengths of the floating gates are defined by the spacing between isolation regions, and the positions of the floating gates are precisely defined.

7 Claims, 21 Drawing Sheets

METHOD FOR FORMING SELF-ALIGNED FLOATING GATES

BACKGROUND OF THE INVENTION

1. Field of the Invention

The present invention relates to a method for forming floating gates and, more particularly, to a method for forming self-aligned floating gates.

2. Description of the Related Art

A non-volatile memory cell is a device that retains information stored in the memory cell when the power to the cell is removed. One type of commonly used non-volatile memory cell is an electrically erasable programmable read-only-memory (EEPROM) cell. For most applications, a large number of EEPROM cells are arranged in rows and columns to form an array of EEPROM cells.

FIG. 1A shows a plan view that illustrates a portion of a prior-art EEPROM array 100. FIG. 1B shows a cross-sectional view taken along line 1B—1B of FIG. 1A, while FIG. 1C shows a cross-sectional view taken along line 1C—1C of FIG. 1A. As shown in FIGS. 1A–1C, array 100 includes a number of EEPROM cells 110 that are each formed in a p-type semiconductor material 112.

Each EEPROM cell 110 includes a n+source region 114, a n+buried region 116, and a n+drain region 118 that are formed in semiconductor material 112. In addition, a memory-transistor channel region 120 is defined between source region 114 and buried region 116, while an access-transistor channel region 122 is defined between buried region 116 and drain region 118.

Further, each EEPROM cell 110 includes a layer of tunnel oxide 124 that is formed on buried region 116, and a layer of gate oxide 128 which is formed on buried region 116 around tunnel oxide region 124. In addition, gate oxide layer 128 is formed on memory-transistor channel region 120, and access-transistor channel region 122.

Each EEPROM cell 110 also includes a memory-transistor floating gate 130 that is formed on tunnel oxide layer 124 and gate oxide layer 128 over channel region 120. Each cell 110 additionally includes an access-transistor floating gate 132 that is formed on tunnel oxide layer 126 and gate oxide layer 128 over channel region 122.

Further, each cell 110 includes a layer of interpoly dielectric 134, such as oxide-nitride-oxide (ONO), that is formed on floating gates 130 and 132. In addition, a memory-transistor control gate 136 is formed on dielectric layer 134 over floating gate 130, and an access-transistor control gate 138 is formed on dielectric layer 134 over floating gate 132.

As further shown in FIGS. 1A–1C, array 100 also includes a number of diffused source lines 140 that are formed in semiconductor material 112 so that each source region 114 in a row of source regions is connected to a diffused source line 140. Array 100 further includes a number of bit line contact regions 142 that are formed in semiconductor material 112 so that each drain region 118 is connected to a bit line contact region 142.

Array 100 additionally includes a number of word lines 144 which are formed so that each memory-transistor control gate 136 in a row of memory-transistor control gates 136 is connected to a word line 144. Further, a number of access lines 146 are formed so that each access-transistor control gate 138 in a row of access-transistor control gates 138 is connected to an access line 146. Array 100 also includes a number of field oxide regions FOX that are formed in semiconductor material 116. The field oxide regions FOX provide isolation between adjacent cells 110 in the same row of cells.

With the continuing miniaturization of integrated circuits, there is a continuing need to reduce the size of the memory array or, alternately, increase the density of the memory array. One feature that limits the size and density of array 100 is the pitch of the floating gates. Pitch is defined as the distance from a point on a floating gate to an equivalent point on an adjacent floating gate in the same row, and is shown as distance P on FIG. 1A.

The pitch has two significant components: the length of the floating gate, and the isolation spacing between adjacent floating gates in the same row of floating gates. Unless the floating gates have large "wings", a value must be added to the minimum length of the floating gates to accommodate for misalignment error. (Misalignment occurs when the floating gate is not completely formed over the channel.)

Thus, if the misalignment error can be reduced, the length of the floating gate can be reduced. This allows the pitch P to be reduced which, in turn, allows the size of the array to be reduced or the density of the array to be increased. As a result, there is a need for a technique that reduces the misalignment error and, therefore, reduces the size of the array.

SUMMARY OF THE INVENTION

The method of the present invention substantially eliminates the misalignment error added to the minimum length of floating gates by forming self-aligned floating gates. As a result, the density of a memory array can be increased.

In accordance with the present invention, the method includes the step of forming a number of trenches in a semiconductor material of a first conductivity type. The method also includes the step of forming a layer of isolation material in the trenches to fill up the trenches. Next, the layer of isolation material is planarized to form a number of isolation regions with substantially planar top surfaces. The top surface of each isolation region lies above the top surface of the semiconductor material.

The method of the present invention further includes the step of forming a first layer of dielectric material on the semiconductor material after the number of isolation regions have been formed. Next, a first layer of conductive material is formed over the first layer of dielectric material and the isolation regions. Following this, the first layer of conductive material is planarized until the layer of first conductive material is removed from the top surfaces of the isolation regions.

The present invention also includes an array of memory cells that are formed in a semiconductor material of a first conductivity type. The array has a number of spaced-apart isolation regions which each have substantially planar top surfaces that lie above the top surface of the semiconductor material.

The array also has a first layer of dielectric material that is formed on the top surface of the semiconductor material, and a number of floating gates that are formed on the first layer of dielectric material. The floating gates contact the isolation region and have top surfaces that are substantially level with the top surfaces of the isolation regions.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a plan view, FIG. 1B is a cross-sectional view taken along line 1B—1B of FIG. 1A, and FIG. 1C is a cross-sectional view taken along line 1C—1C of FIG. 1A.

FIGS. 2A–12A are plan views. FIGS. 2B–12B are cross-sectional views taken along lines 2B—2B to 12B—12B of FIGS. 2A–12A, respectively. FIGS. 2C–12C are cross-sectional views taken along lines 2C—2C to 12C—12C of FIGS. 2A–12A, respectively.

FIG. 13A is a plan view, FIG. 13B is a cross-sectional view taken along line 13B—13B of FIG. 13A, and FIG. 13C is a cross-sectional view taken along line 13C—13C of FIG. 13A.

FIGS. 14A–17A are plan views. FIGS. 14B–17B are cross-sectional views taken along lines 14B—14B to 17B—17B of FIGS. 14A–17A, respectively. FIGS. 14C–17C are cross-sectional views taken along lines 14C—14C to 17C—17C of FIGS. 14A–17A, respectively.

FIG. 18A is a plan view, FIG. 18B is a cross-sectional view taken along line 18B—18B of FIG. 18A, and FIG. 18C is a cross-sectional view taken along line 18C—18C of FIG. 18A.

DETAILED DESCRIPTION

FIGS. 2A–2C through 12A–12C are drawings that illustrate a method of forming self-aligned floating gates in accordance with the present invention. As described in greater detail below, the method of the present invention forms shallow trench isolation (STI) regions with widths equal to the required floating gate-to-floating gate isolation spacing. The spacing between isolation regions precisely defines the lengths of the floating gates, while the structure of the isolation regions precisely defines the positions of the floating gates, thereby largely eliminating the misalignment error.

Figure 1A:
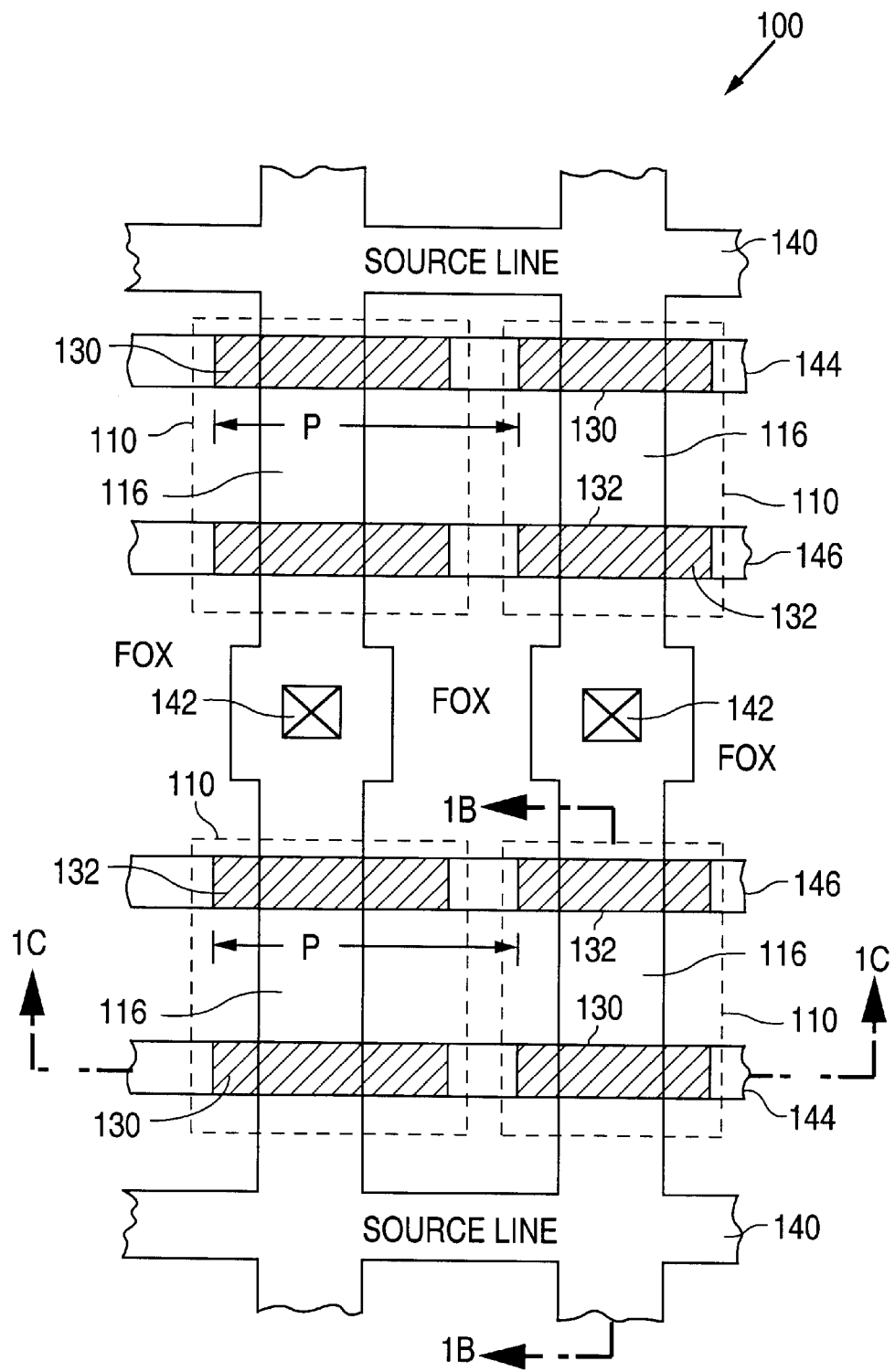
FIGS. 1A–1C are drawings illustrating a portion of a prior-art EEPROM array 100.
Figure 1B:
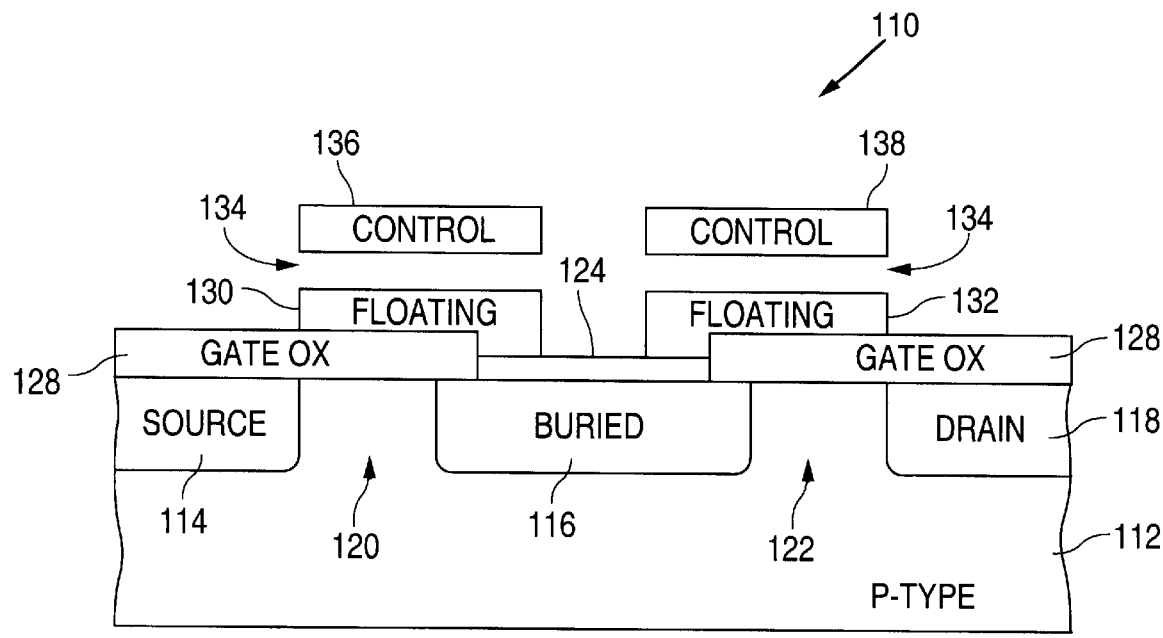
Figure 1C:
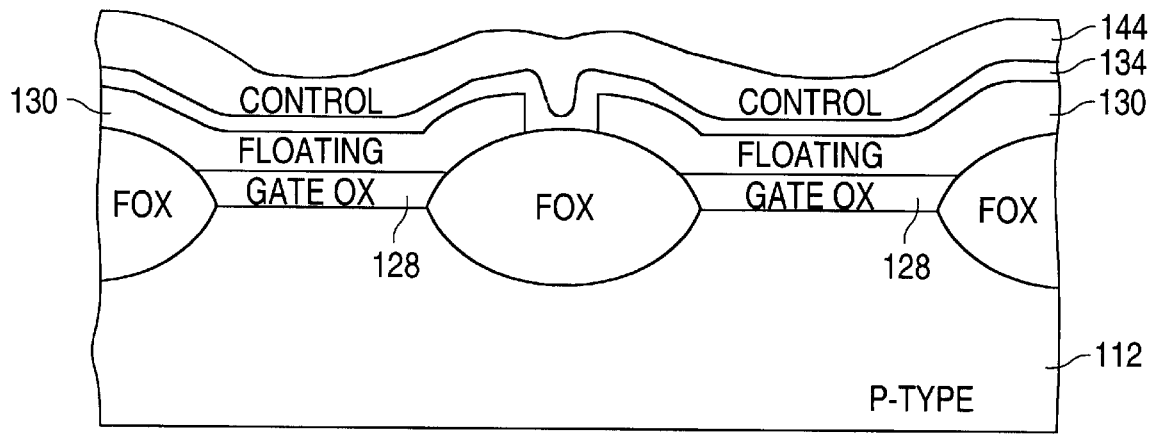
Figure 2A:
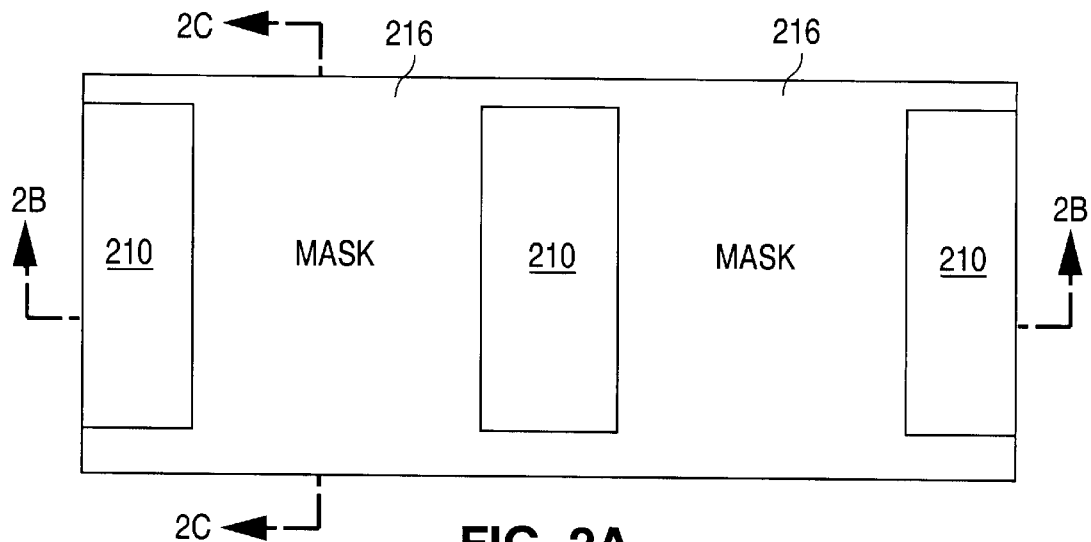
FIGS. 2A–2C through 12A–12C are drawings illustrating a method of forming self-aligned floating gates in accordance with the present invention.
Figure 2B:
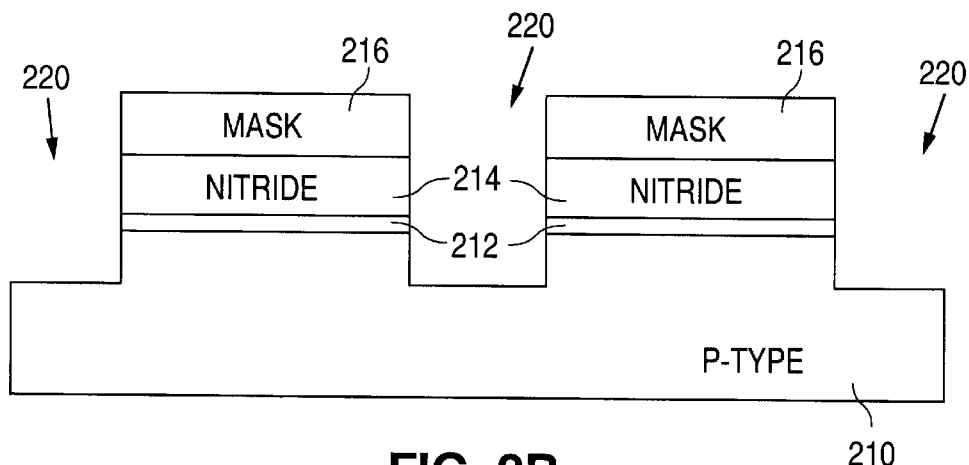
Figure 2C:
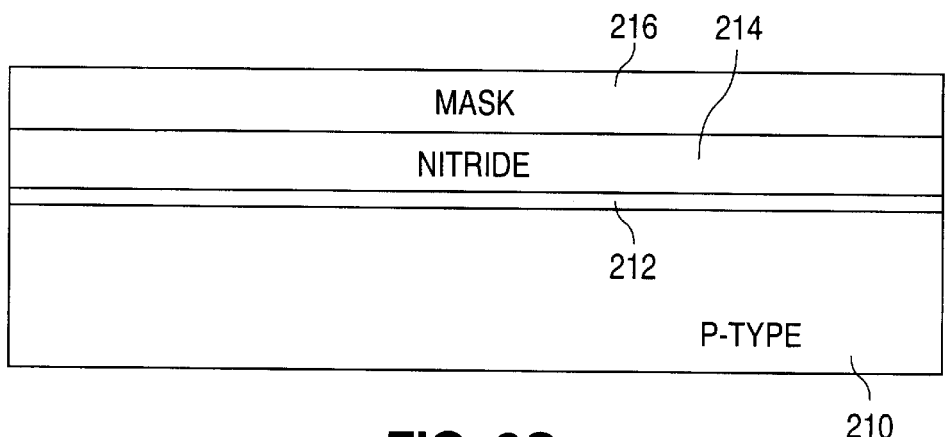

The method of the present invention is illustrated as a part of a method for forming an array of electrically-erasable programmable read-only-memory (EEPROM) cells. The method begins with the formation of STI regions that are used to isolate adjacent EEPROM cells. As shown in FIGS. 2A–2C, the STI regions are formed by forming a layer of pad oxide 212 on a p-type semiconductor material 210, such as a well or a substrate. Next, a layer of silicon nitride 214 is formed on pad oxide layer 212, followed by the formation of a trench mask 216 on silicon nitride layer 214.

After this, trench mask 216 is patterned to expose a number of regions on the surface of nitride layer 214 that correspond with a number of to-be-formed STI regions. The exposed regions on the surface of nitride layer 214 have widths that are slightly larger than the minimum isolation spacing allowed between adjacent floating gates in the same row of floating gates.

Once trench mask 216 has been patterned, the exposed regions of silicon nitride layer 214, and the underlying regions of pad oxide layer 212 and material 210, are etched until a number of trenches 220 have been formed in material 210. Trench mask 216 is then removed. (A channel stop implant may optionally be performed prior to the removal of trench mask 216.)

Figure 3A:
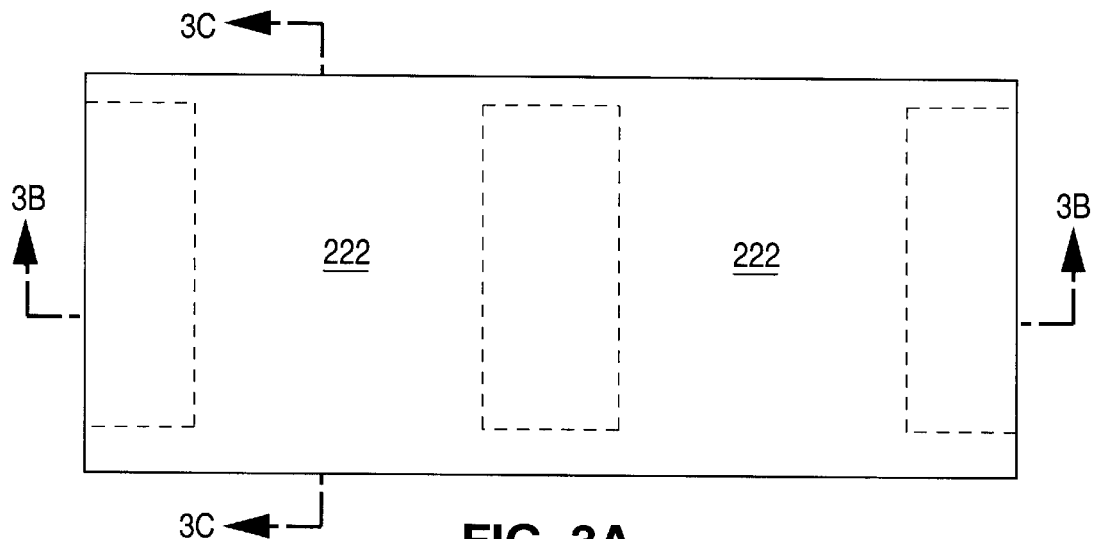
Figure 3B:
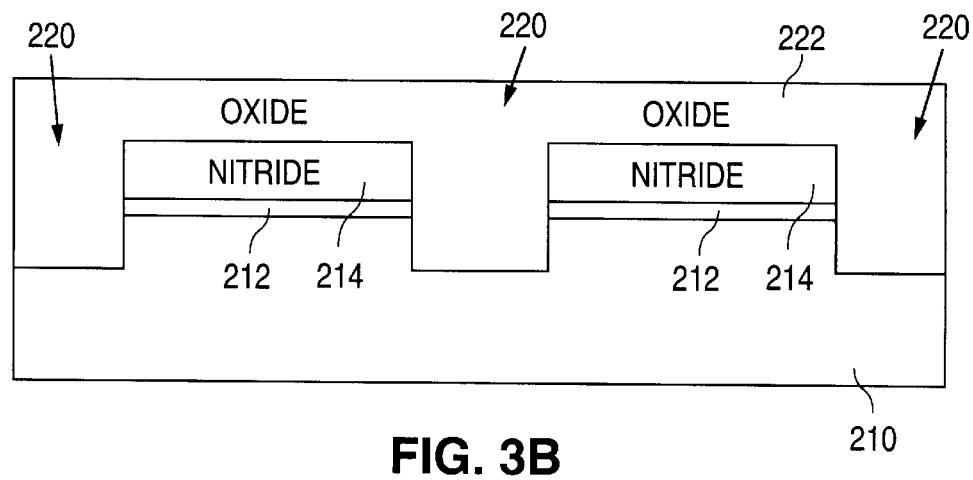
Figure 3C:
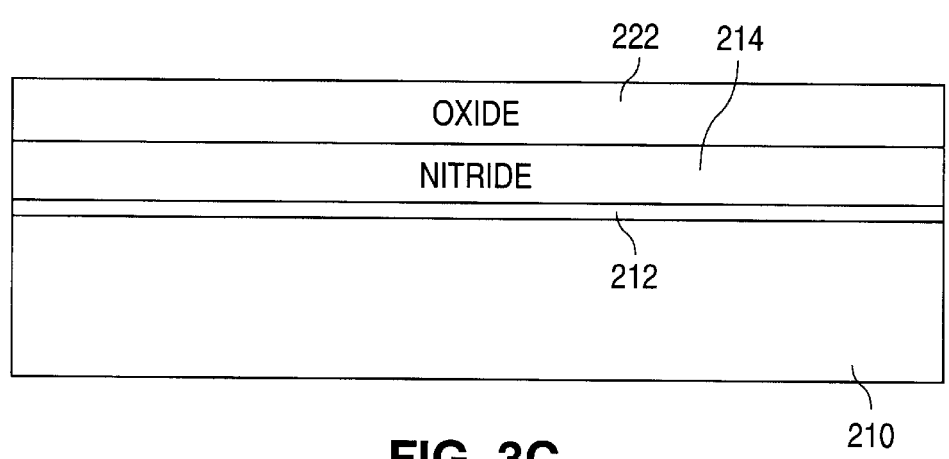

Next, as shown in FIGS. 3A–3C, a layer of oxide 222 is formed on the surfaces of nitride layer 214 and trenches 220. Oxide layer 222, which can include a thin passivation layer of oxide grown first on the trench surfaces, has a thickness that is sufficient to fill trenches 220. Trenches 220 can be formed, for example, using prior-art high-density plasma chemical-vapor deposition (HDPCVD) fabrication techniques.

Figure 4A:
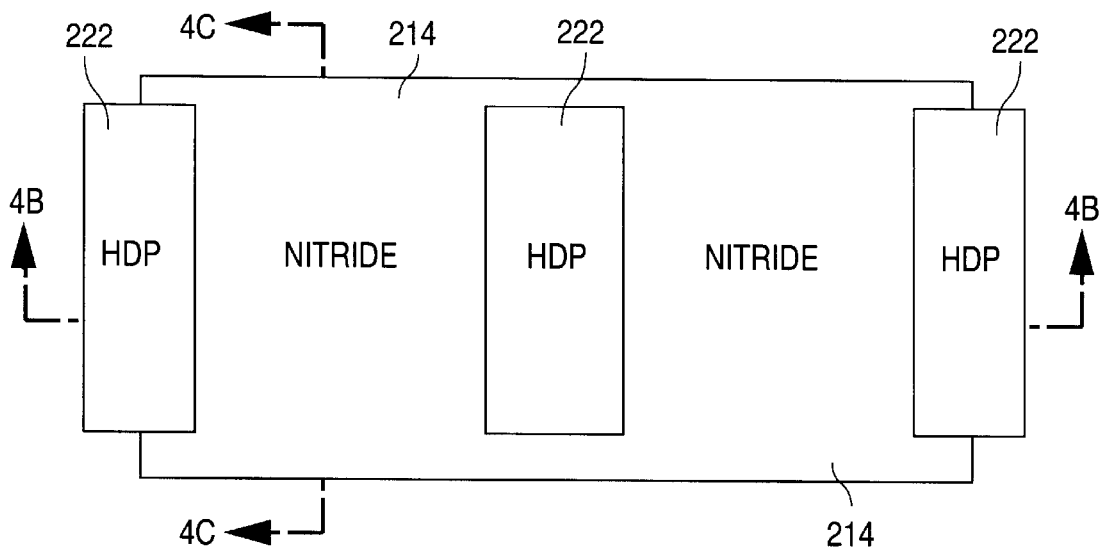
Figure 4B:
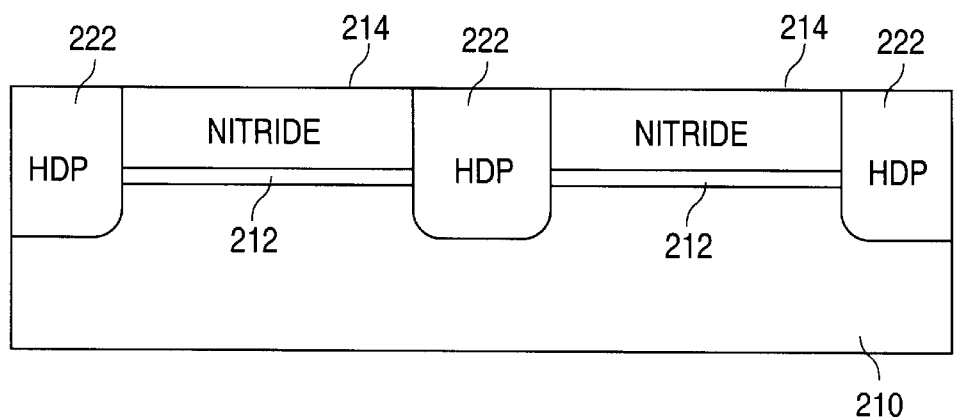
Figure 4C:
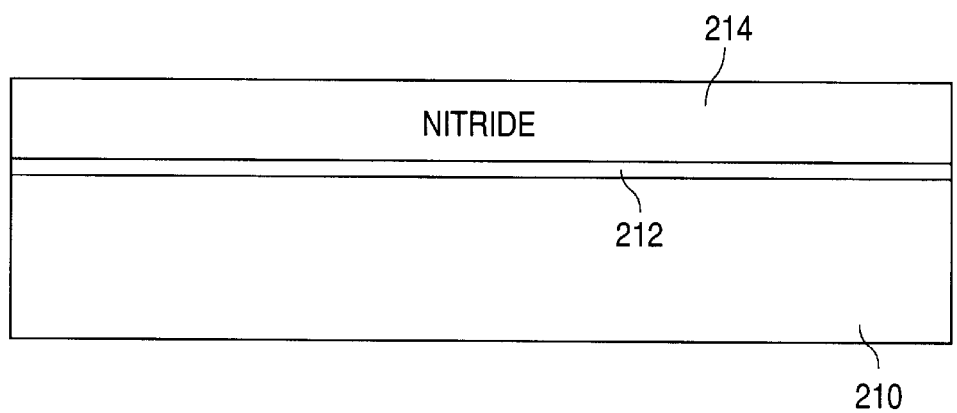

Following this, as shown in FIGS. 4A–4C, oxide layer 222 is planarized until oxide layer 222 has been removed from the surface of nitride layer 214. Oxide layer 222 can be planarized using prior-art chemical-mechanical polishing (CMP) or other well-known techniques. As a result, the top surface of oxide layer 222 is substantially level with the top surface of nitride layer 214 (some dishing may occur with CMP techniques). When HDPCVD techniques are utilized, the planarizing step forms a number of high-density plasma STI regions HDP.

Figure 5A:
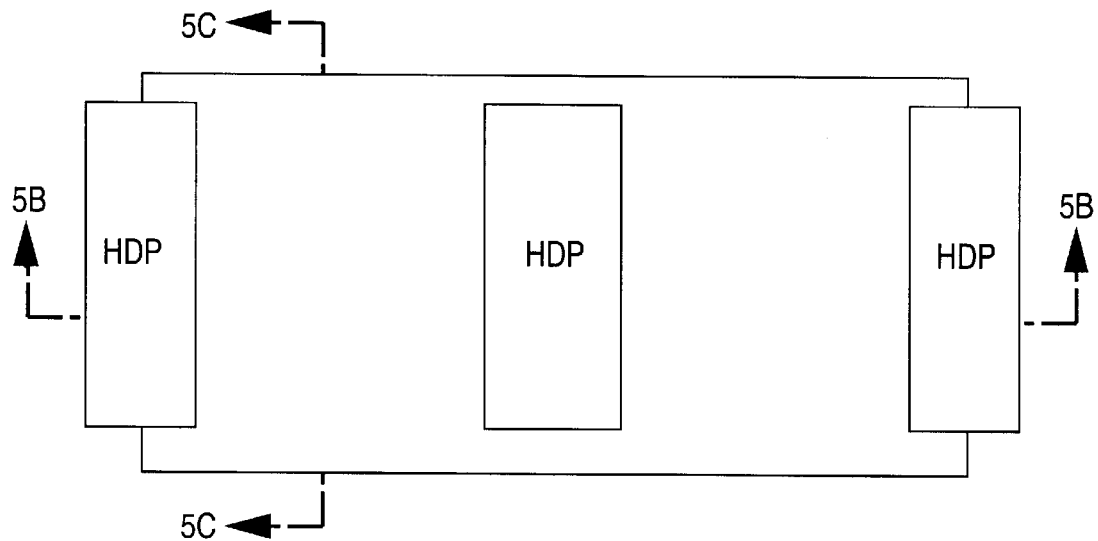
Figure 5B:
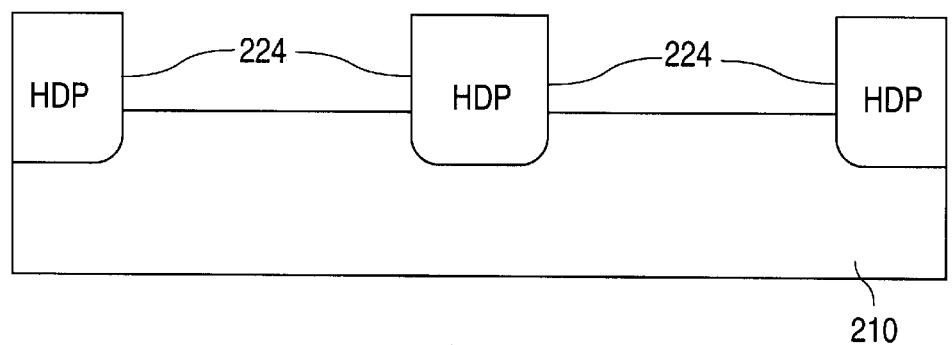
Figure 5C:
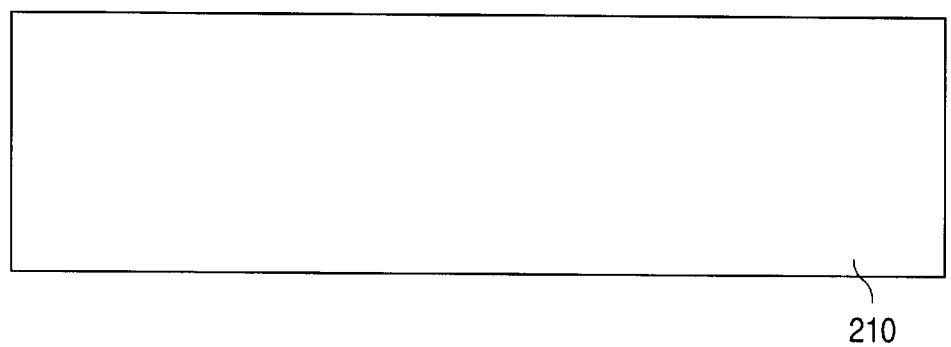
Figure 6A:
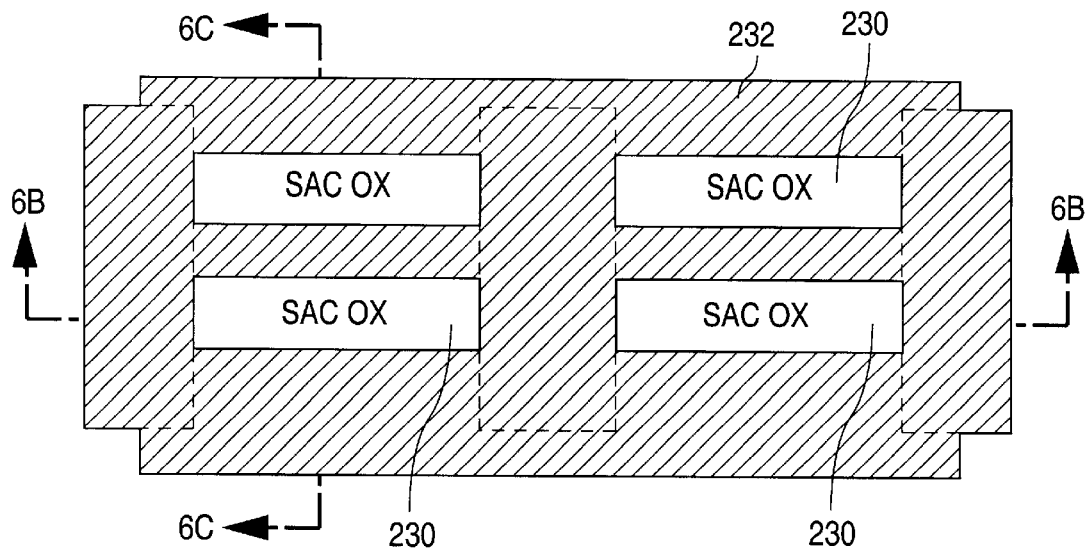
Figure 6B:
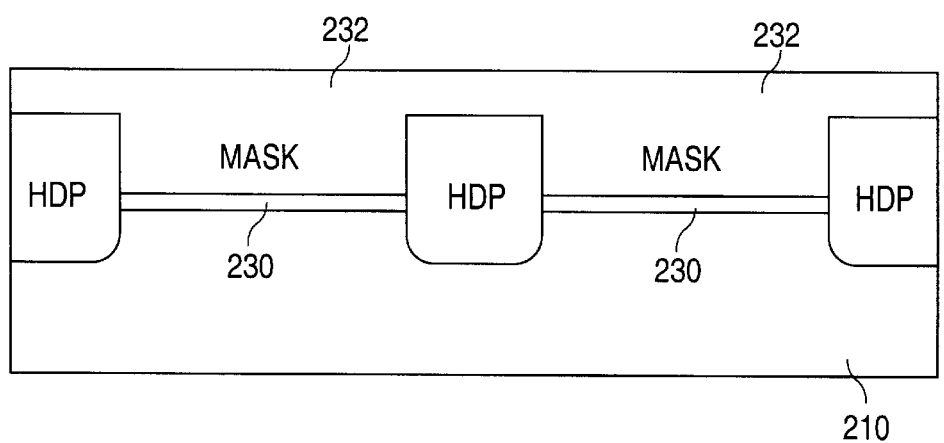
Figure 6C:
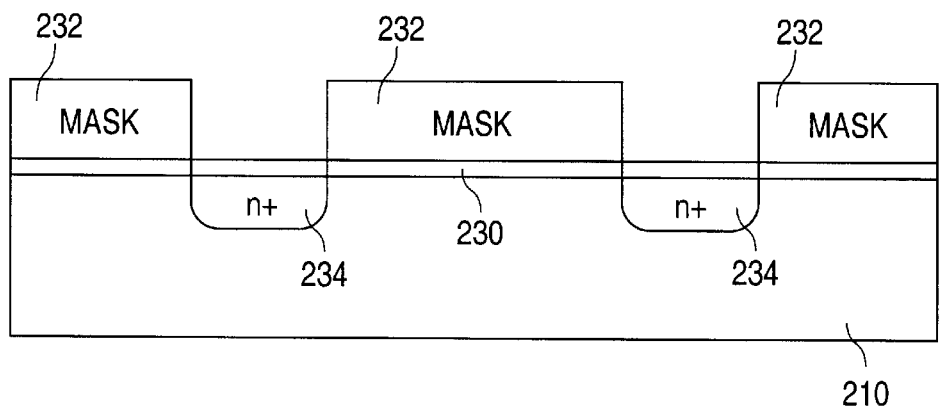

Next, as shown in FIGS. 5A–5C, nitride layer 214 is removed, followed by the removal of pad oxide layer 212. The removal of layers 212 and 214 exposes an upper side wall 224 of each STI region HDP. After layers 212 and 214 have been removed, as shown in FIGS. 6A–6C, a layer of sacrificial oxide 230 is formed on semiconductor material 210, followed by the formation of a first implant mask 232 on oxide layer 230.

Implant mask 232 is then patterned to expose a number of regions on the surface of oxide layer 230 that correspond with a number of to-be-formed n+buried regions. Once implant mask 232 has been patterned, the exposed regions of oxide layer 230 are implanted with a dopant, such as phosphorous or arsenic, to form a number of buried regions 234. Implant mask 232 is then removed.

Figure 7A:
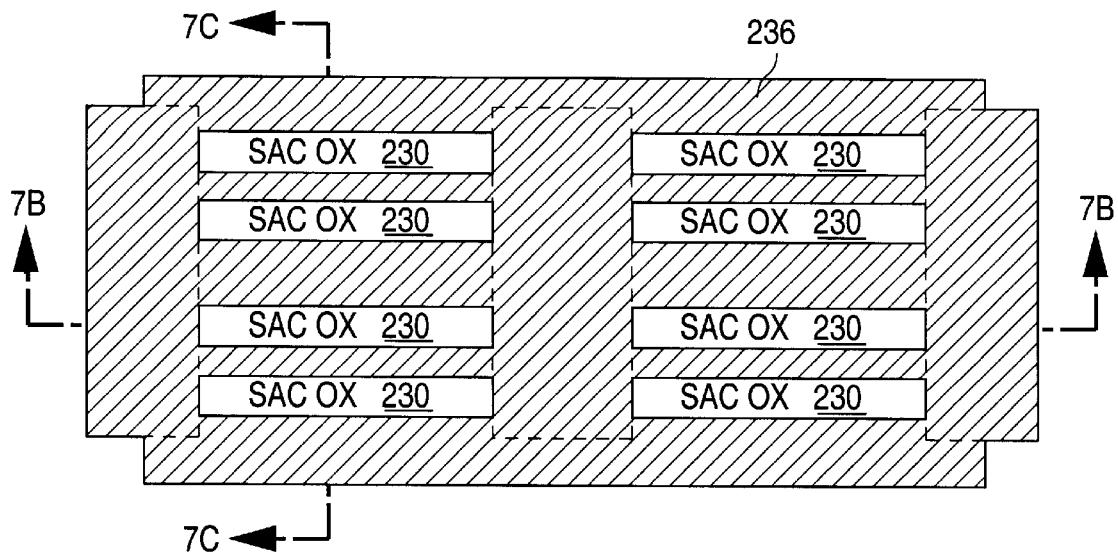
Figure 7B:
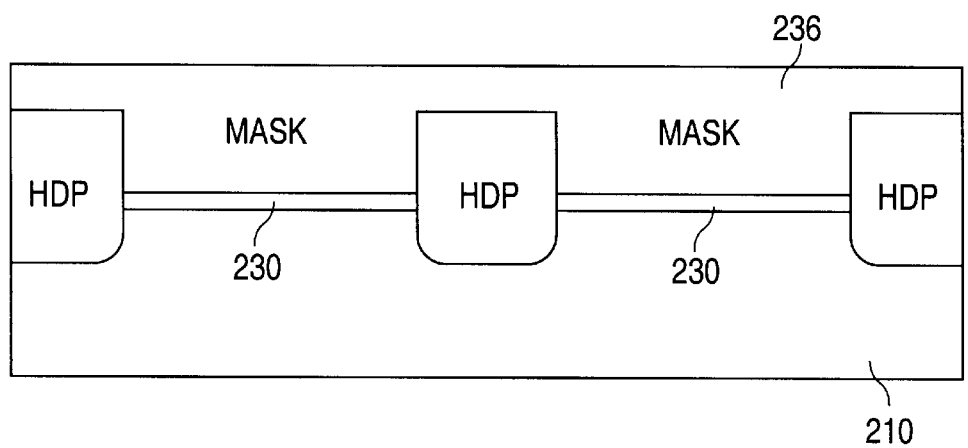
Figure 7C:
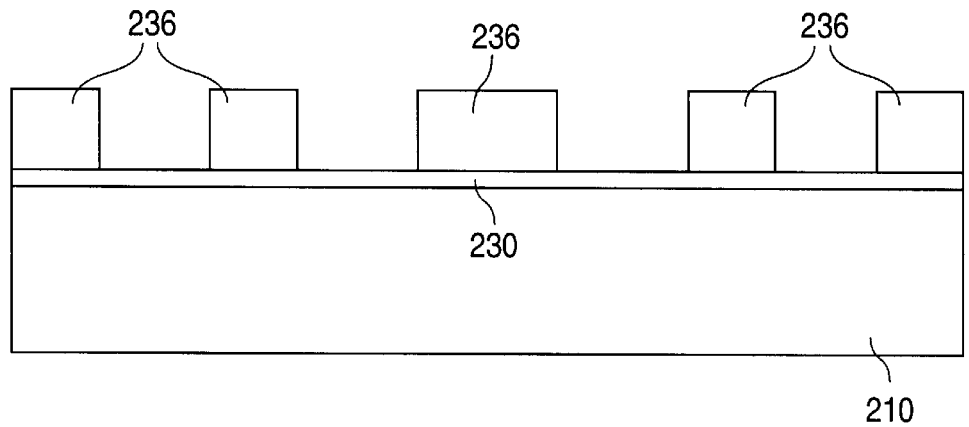

Next, as shown in FIGS. 7A–7C, a threshold voltage mask 236 is formed on oxide layer 230. Threshold voltage mask 236 is then patterned to expose a number of regions on the surface of oxide layer 230 that correspond with a number of to-be-formed channel regions. Once threshold mask 236 has been patterned, the exposed regions of oxide layer 230 are implanted with a dopant to set the threshold voltages of the to-be-formed memory and access transistors of each EEPROM cell. Threshold mask 236 and sacrificial oxide layer 230 are then removed. Oxide layer 230, in turn, is removed with a dip that laterally etches into the side walls of the STI regions HDP.

Figure 8A:
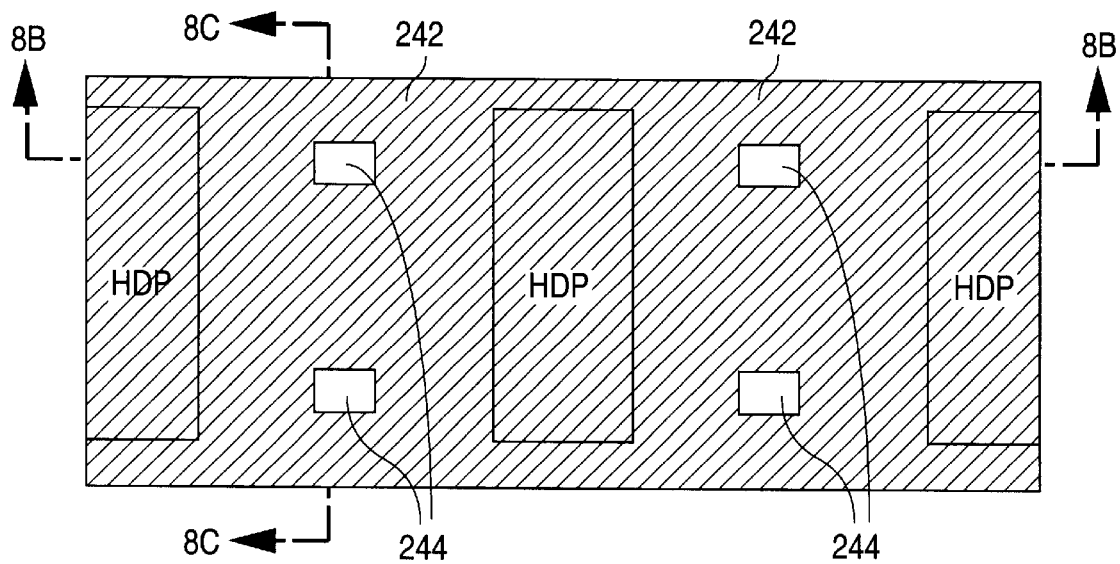
Figure 8B:
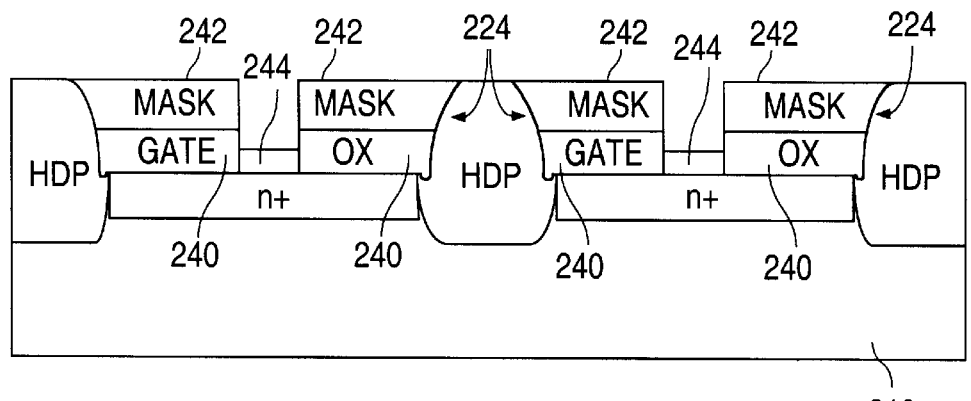
Figure 8C:
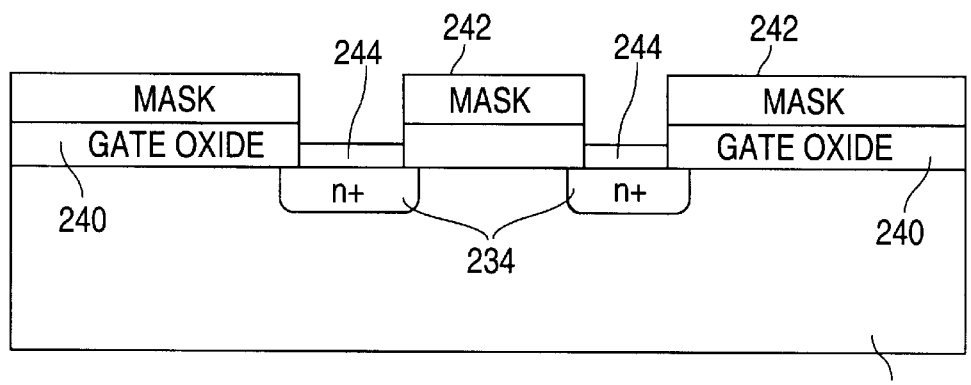

As shown in FIGS. 8A–8C, the upper side wall 224 of each STI region HDP is laterally etched by the dip. The widths of each STI region HDP must be large enough to accommodate the lateral etching from the dip yet still provide the minimum isolation spacing for adjacent floating gates in the same row of floating gates.

Next, a layer of gate oxide 240 is formed on substrate material 210. Following this, a tunneling mask 242 is formed on gate oxide layer 240 over the buried regions 234. Tunneling mask 242 is then patterned to expose a number of regions on the surface of gate oxide layer 240 that correspond with a number of to-be-formed tunnel windows.

Once tunneling mask 242 has been patterned, the exposed regions of gate oxide layer 240 are etched until gate oxide layer 240 is removed from the surfaces of the buried regions 234. Following this, a layer of tunnel oxide 244 is grown on the exposed surfaces of the buried regions 234. Tunneling mask 242 is then removed.

Figure 9A:
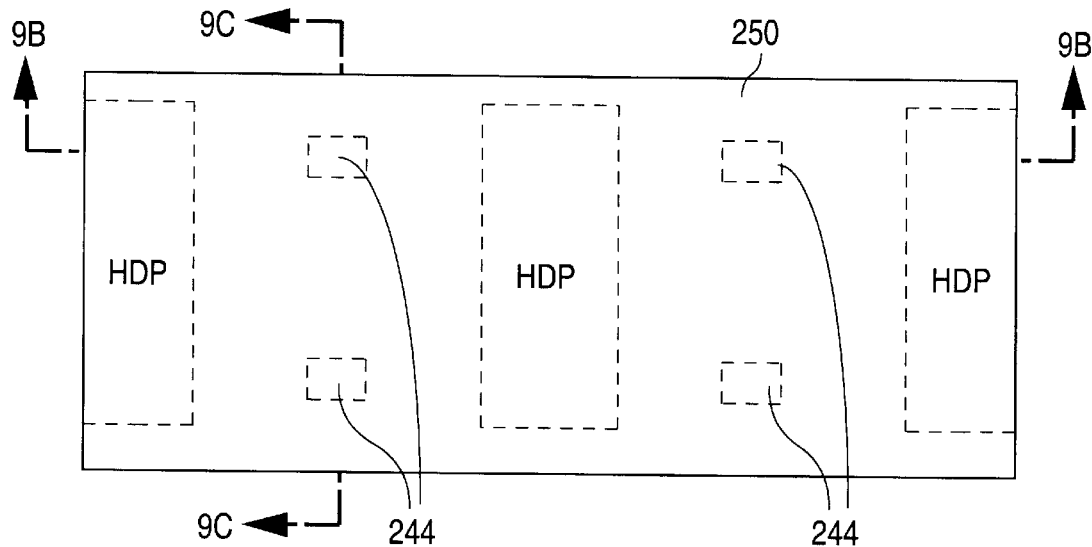
Figure 9B:
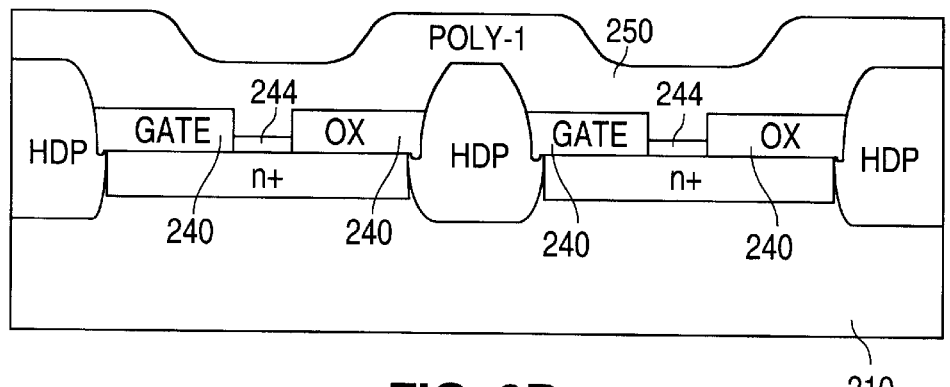
Figure 9C:
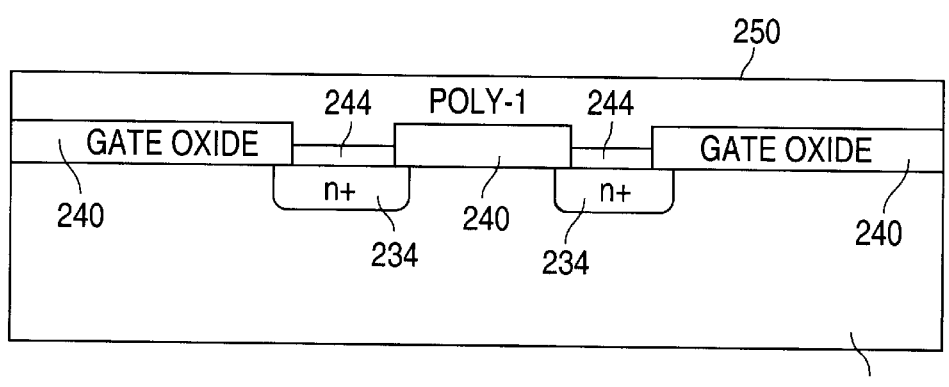
Figure 10A:
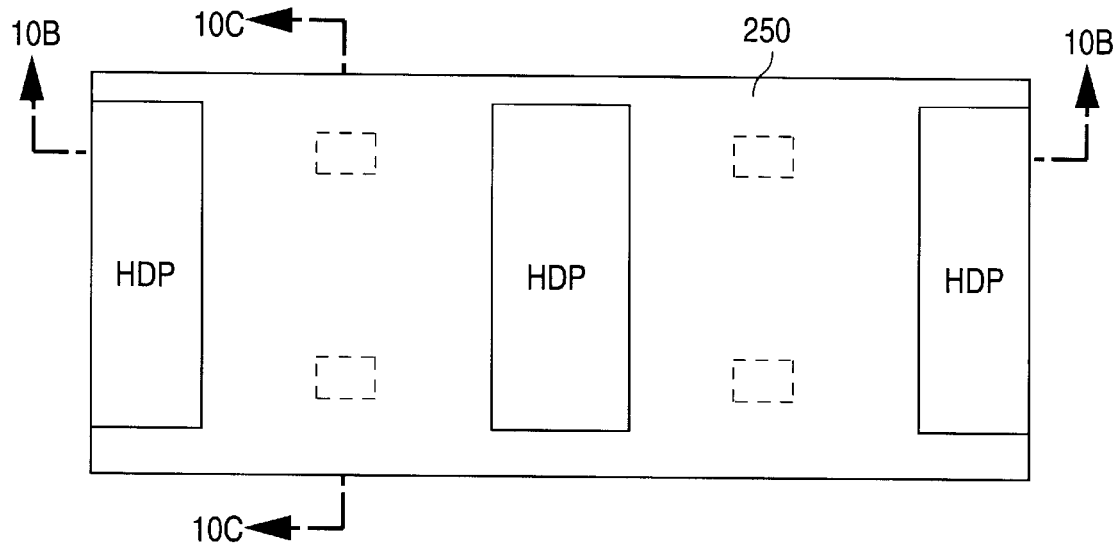
Figure 10B:
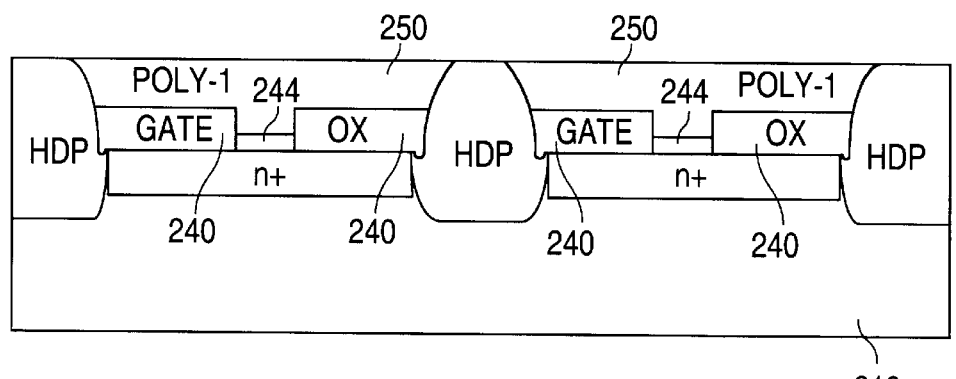
Figure 10C:
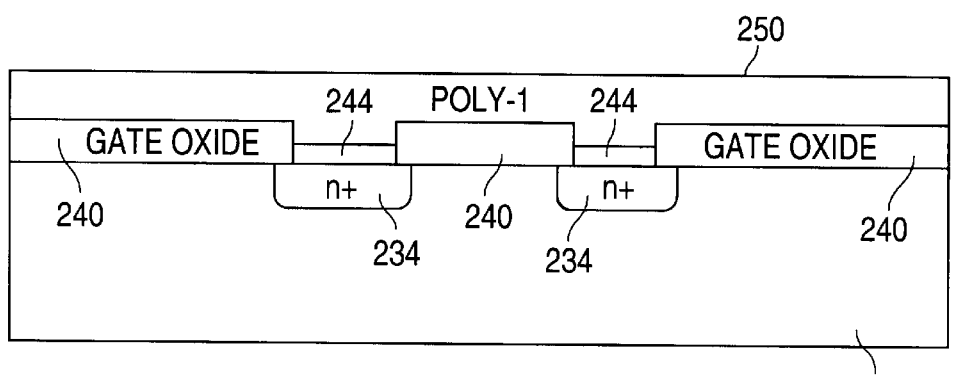

After this, as shown in FIGS. 9A–9C, a first layer of polysilicon (poly-1) 250 is formed on gate oxide layer 240, tunnel oxide layer 244, and the STI regions HDP. Next, in accordance with the present invention, as shown in FIG. 10A–10C, poly-1 layer 250 is planarized until poly-1 layer 250 is removed from the top surfaces of the STI regions HDP.

In subsequent processing steps, poly-1 layer 250 is etched again to form floating gates. By planarizing poly-1 layer 250 at this step, the lengths of these floating gates are self-aligned, and therefore have a length defined by the distance between adjacent STI regions HDP, and a precisely defined position. As a result, the misalignment error is significantly reduced.

Figure 11A:
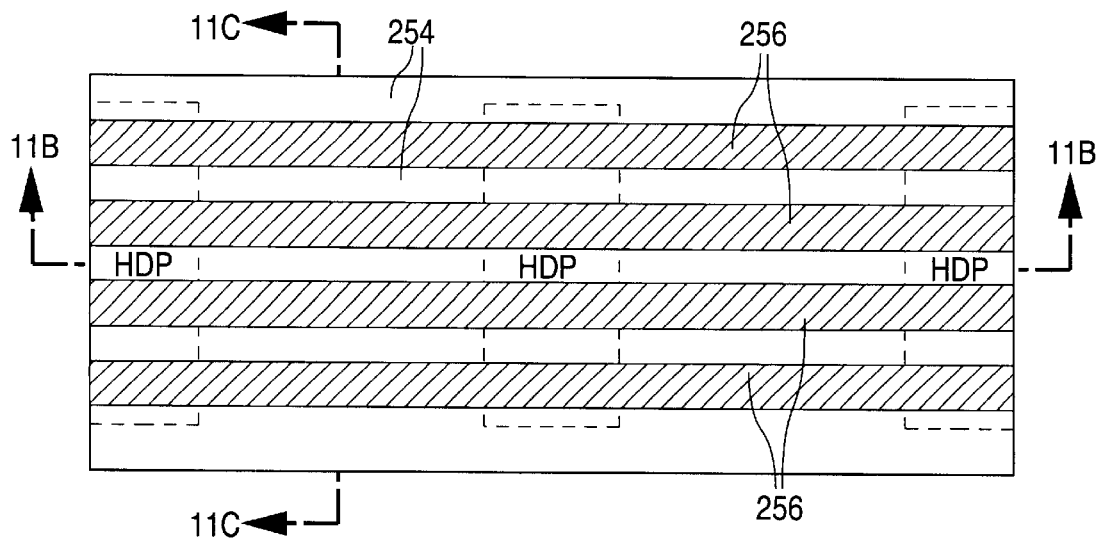
Figure 11B:
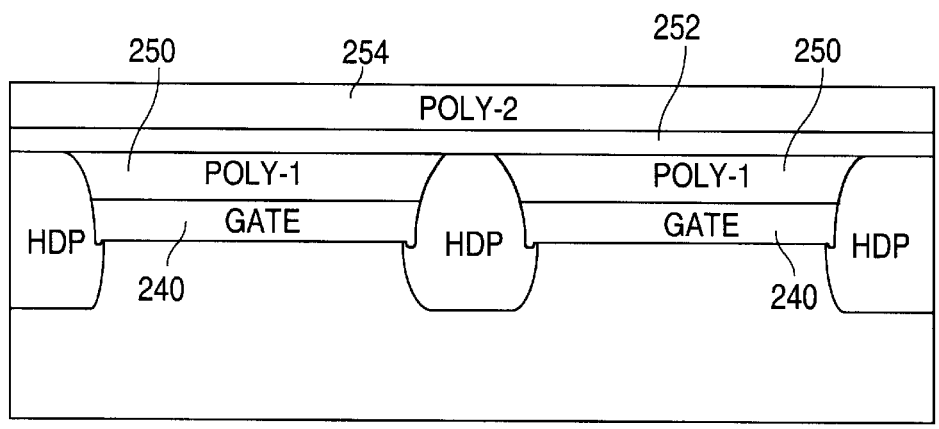
Figure 11C:
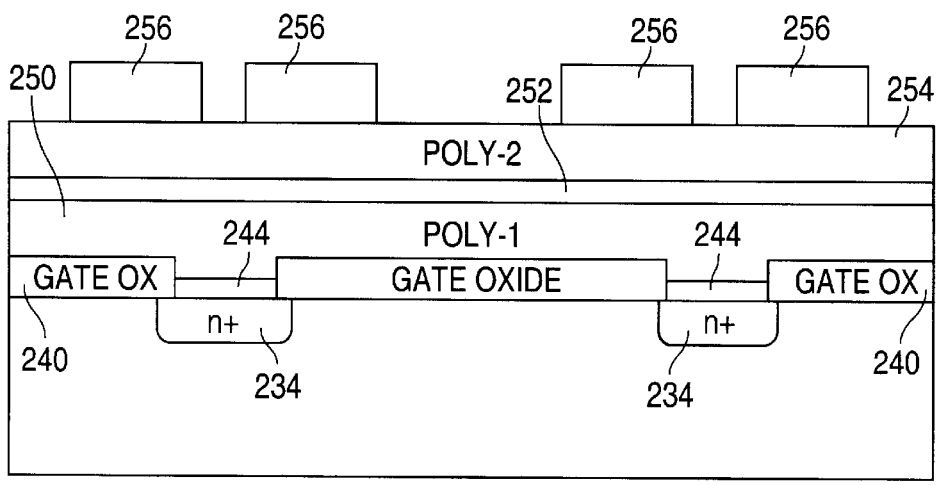

As shown in FIGS. 11A–11C, after the planarization has been completed, an oxide-nitride-oxide (ONO) layer 252 is formed on poly-1 layer 250 and the STI regions HDP, followed by the formation of a second layer of polysilicon (poly-2) 254 on ONO layer 252. Next, a word line/access line mask 256 is formed on poly-2 layer 254. Word line/access line mask 256 is then patterned to define a number of strips on the surface of poly-2 layer 254 that correspond with a number of to-be-formed word lines and access lines.

Figure 12A:
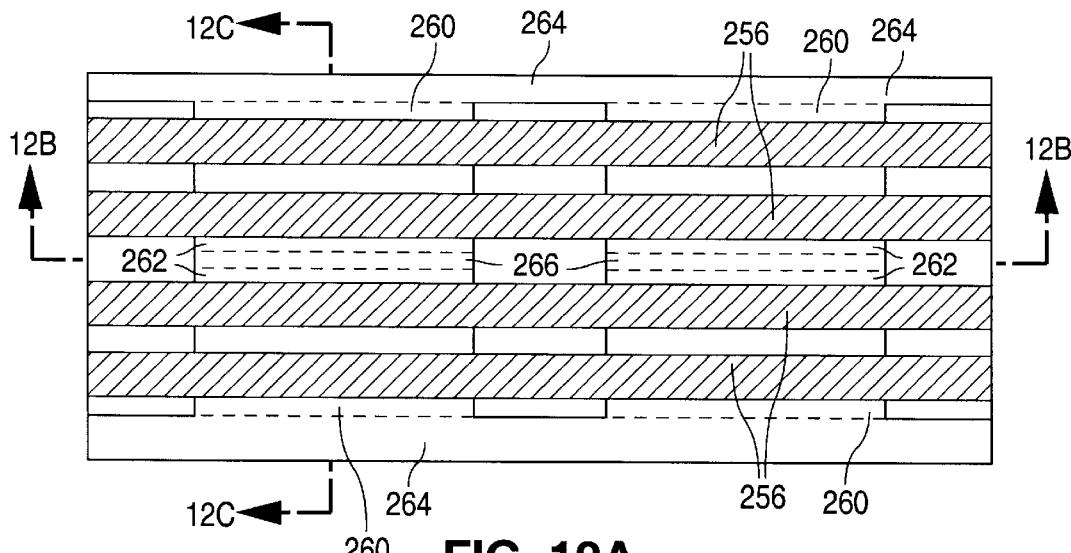
Figure 12B:
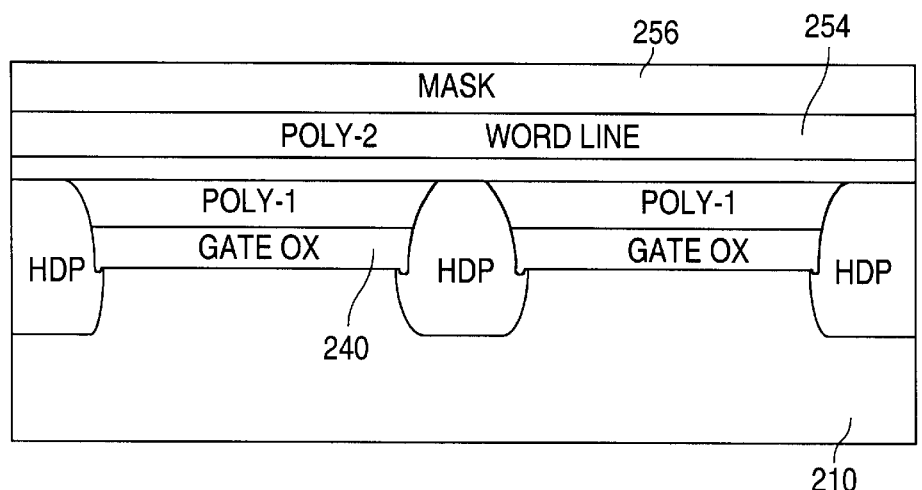
Figure 12C:
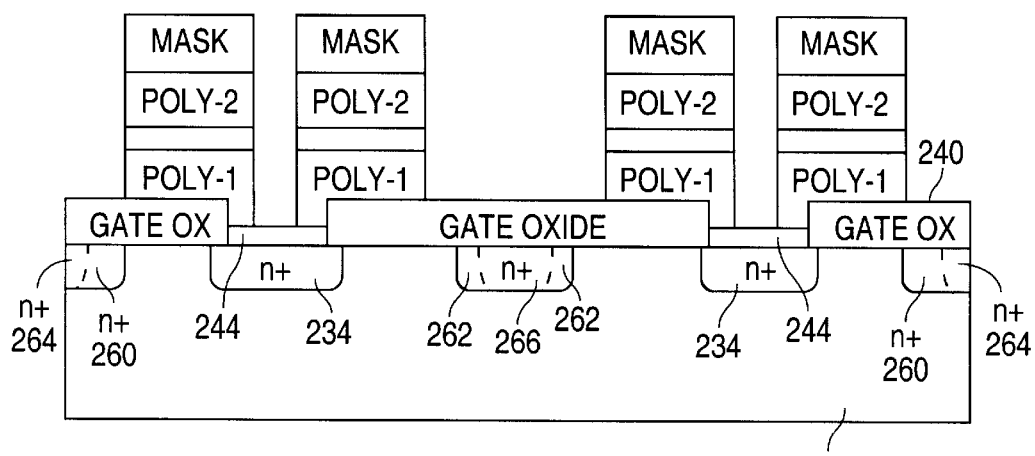

As shown in FIGS. 12A–12C, once word line/access line mask 256 has been patterned, the exposed regions of poly-2 layer 254 and underlying layers of ONO 252 and poly-1 250 are etched until the exposed regions of poly-1 layer 250 are removed from the surface of gate oxide layer 240.

The etch of poly-2 layer 254 defines a number of word lines and access lines, while the etch of poly-1 layer 250 defines a number of floating gates. The etch also exposes regions of oxide layer 240 that correspond with a number of to-be-formed source regions, a number of to-be-formed source lines, a number of to-be-formed drain regions, and a number of to-be-formed drain contact regions.

Following the etch, the exposed regions of oxide layer 240 are implanted with a dopant, such as phosphorous or arsenic, to form a number of source regions 260, a number of drain regions 262, a number of source lines 264, and a number of drain contact regions 266 in semiconductor material 210. The source lines 264 are formed so that each source region 260 in a row of source regions 260 is connected to a source line 264. Following this, mask 256 is removed, and the process continues with conventional steps.

Thus, a method of forming floating gates with precisely defined lengths and positions has been described. The misalignment error in the present invention is largely limited to estimating the amount of lateral etch that the side walls 224 of the STI regions HDP experience prior to the deposition of poly-1 layer 250. As a result, the present invention largely eliminates the misalignment error.

Figure 13A:
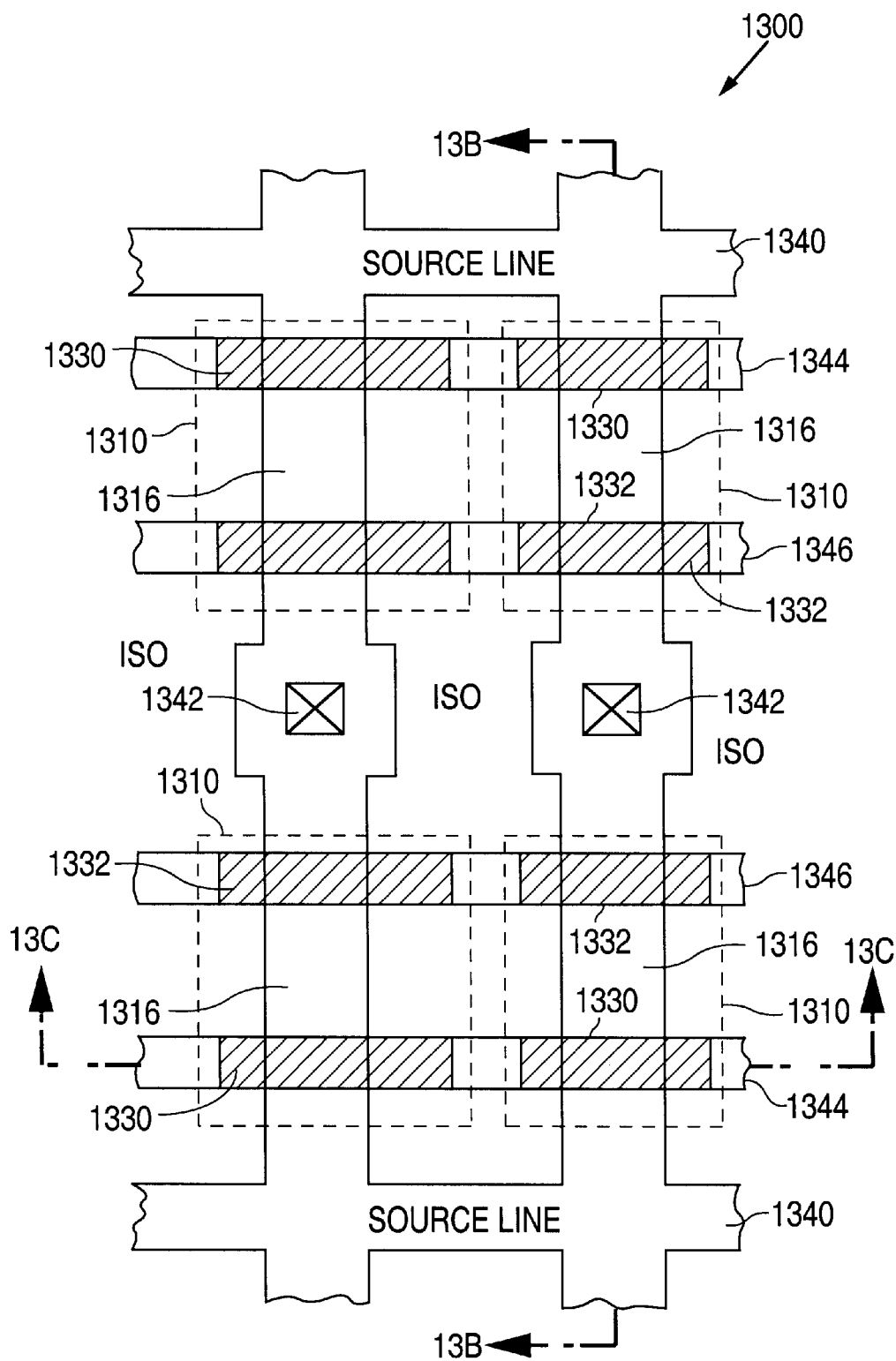
FIGS. 13A–13C are views illustrating a portion of an EEPROM array 1300 that results from the steps of the present invention.
Figure 13B:
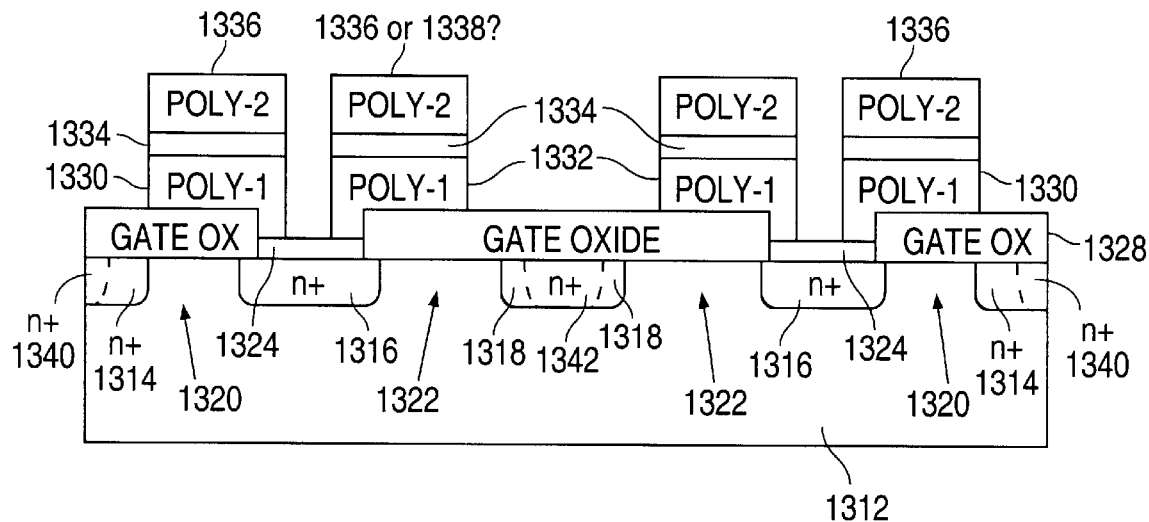
Figure 13C:
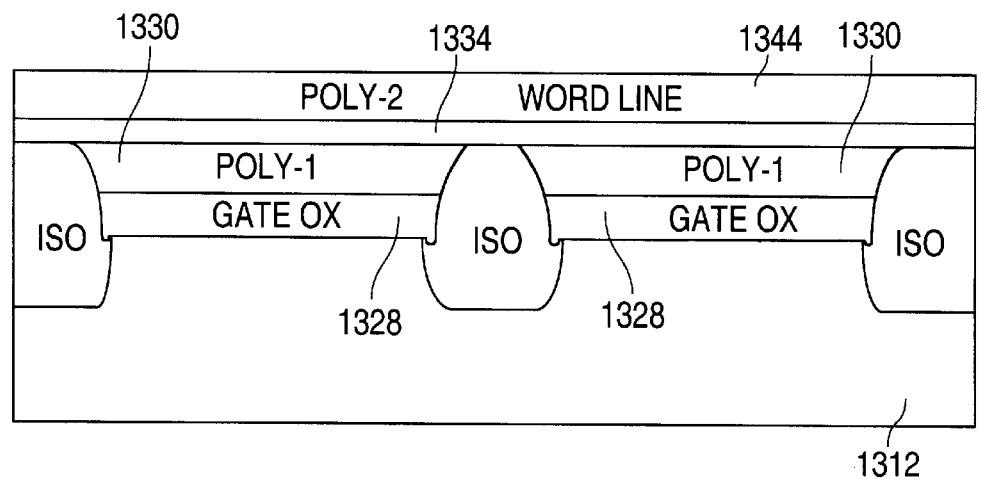
Figure 14A:
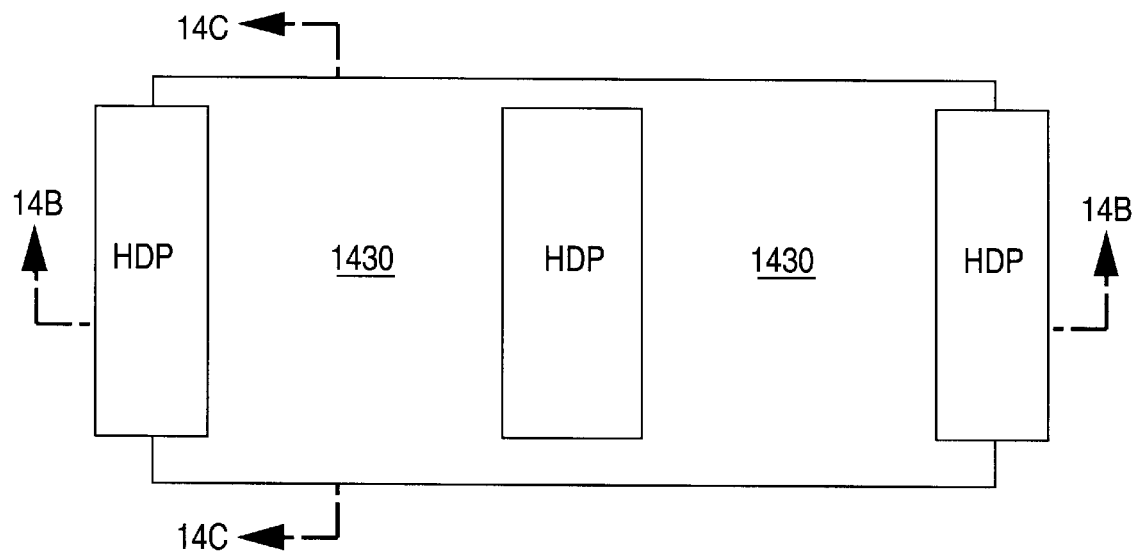
FIGS. 14A–14C through 17A–17C are drawings illustrating the method of the present invention used to form self-aligned floating gates in a flash EPROM array in accordance with the present invention.
Figure 14B:
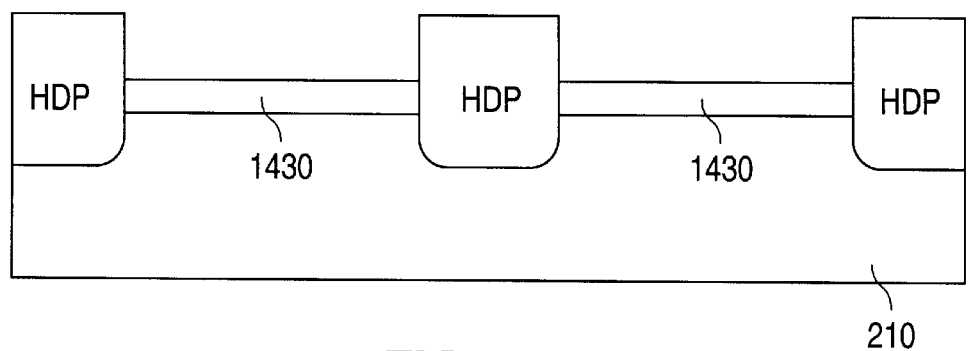
Figure 14C:
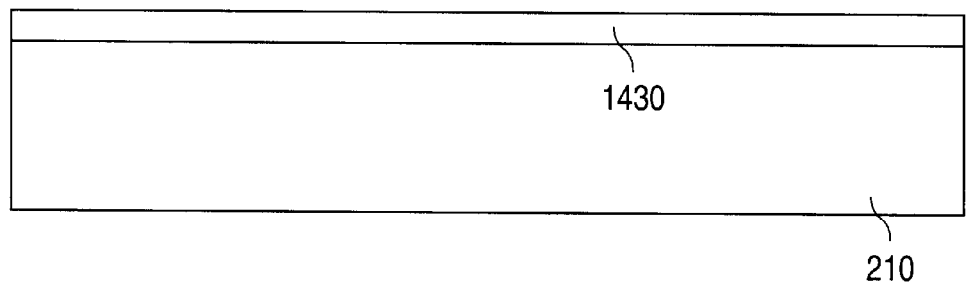

FIGS. 13A–13C show views that illustrate a portion of an EEPROM array 1300 that results from the steps of the present invention. FIG. 13A shows a plan view, FIG. 13B shows a cross-sectional view taken along line 13B—13B of FIG. 13A, and FIG. 13C shows a cross-sectional view taken along line 13C—13C of FIG. 13A. As shown in FIGS. 13A–13C, array 1300 includes a number of EEPROM cells 1310 that are each formed in a p-type semiconductor material 1312.

Each EEPROM cell 1310 includes a n+source region 1314, a n+buried region 1316, and a n+drain region 1318 that are formed in semiconductor material 1312. In addition, a memory-transistor channel region 1320 is defined between source region 1314 and buried region 1316, while an access-transistor channel region 1322 is defined between buried region 1316 and drain region 1318.

Further, each EEPROM cell 1310 includes a layer of tunnel oxide 1324 that is formed on buried region 1316, and a layer of gate oxide 1328 which is formed on buried region 1316 around tunnel oxide region 1324. In addition, gate oxide layer 1328 is formed on memory-transistor channel region 1320, and access-transistor channel region 1322.

Each EEPROM cell 1310 also includes a memory-transistor floating gate 1330 that is formed on tunnel oxide layer 1324 and gate oxide layer 1328 over channel region 1320. Each cell 1310 additionally includes an access-transistor floating gate 1332 that is formed on tunnel oxide layer 1326 and gate oxide layer 1328 over channel region 1322. In accordance with the present invention, floating gates 1330 and 1332 have substantially planar top surfaces.

Further, each cell 1310 includes a layer of interpoly dielectric 1334, such as oxide-nitride-oxide (ONO), that is formed on floating gates 1330 and 1332. In addition, a memory-transistor control gate 1336 is formed on dielectric layer 1334 over floating gate 1330, and an access-transistor control gate 1338 is formed on dielectric layer 1334 over floating gate 1332.

As further shown in FIGS. 13A–13C, array 1300 also includes a number of diffused source lines 1340 that are formed in semiconductor material 1312 so that each source region 1314 in a row of source regions is connected to a diffused source line 1340. Array 1300 further includes a number of bit line contact regions 1342 that are formed in semiconductor material 1312 so that each drain region 1318 is connected to a bit line contact region 1342.

Array 1300 additionally includes a number of word lines 1344 which are formed so that each memory-transistor control gate 1336 in a row of memory-transistor control gates 1336 is connected to a word line 1344. Further, a number of access lines 1346 are formed so that each access-transistor control gate 1338 in a row of access-transistor control gates 1338 is connected to an access line 1346.

Array 1300 also includes a number of isolation regions ISO that are formed in semiconductor material 1316 to provide isolation between adjacent cells 1310 in the same row of cells. In accordance with the present invention, the isolation regions ISO have a substantially planar top surface that is substantially level with the top surfaces of floating gates 1330 and 1332. The isolation regions ISO isolate the floating gates from each other.

Thus, the floating gates of flash memory cell 1310 have precisely defined lengths and positions. The only error that remains is the estimation of the amount of lateral etch that the side walls of the STI regions HDP experience. As a result, the present invention increases the density of the memory array.

The present invention has been illustrated as a method and an array of EEPROM cells. The present invention is not limited to the above-described method and array of EEPROM cells, but applies to other methods and arrays of cells that have rows of STI-isolated floating gate memory transistors. For example, the present invention also applies to the formation of an array of STI-isolated flash electrically-programmable read-only-memory (EPROM) cells.

FIGS. 14A–14C through 17A–17C are drawings illustrating the method of the present invention used to form floating gates in a flash EPROM array in accordance with the present invention. FIGS. 14A–17A are plan views. FIGS. 14B–17B are cross-sectional views taken along lines 14B—14B to 17B—17B of FIGS. 14A–17A, respectively. FIGS. 14C–17C are cross-sectional views taken along lines 14C—14C to 17C—17C of FIGS. 14A–17A, respectively.

The process of forming an array of flash memory cells follows the same steps outlined in FIGS. 2A–2C through 5A–5C. Once layers 212 and 214 have been removed, a layer of sacrificial oxide 1430 is formed on semiconductor material 210. Next, semiconductor material 210 is blanket implanted with a dopant to set the threshold voltages of the flash memory cells. After the threshold voltages have been set, sacrificial oxide layer 1430 is removed with a dip which, as discussed above, laterally etches a portion of the side walls of the STI regions HDP.

Figure 15A:
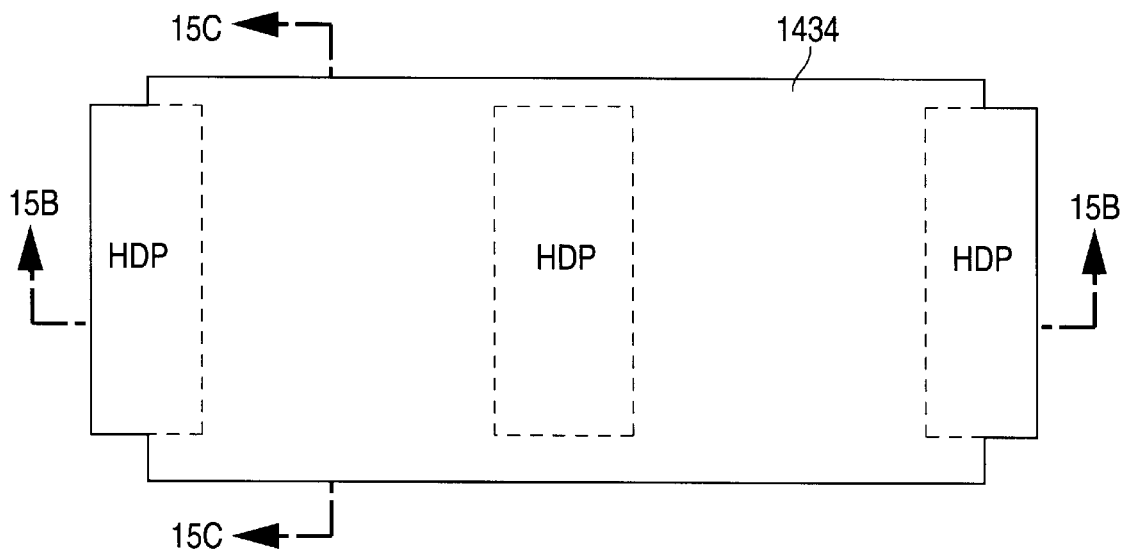
Figure 15B:
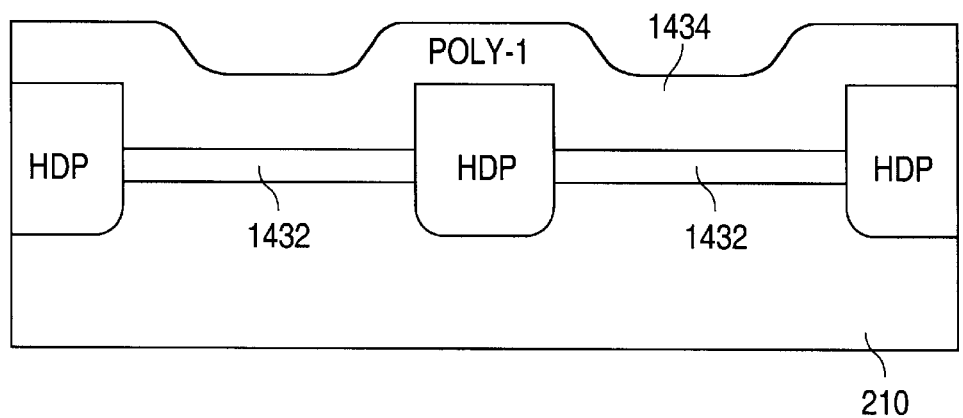
Figure 15C:
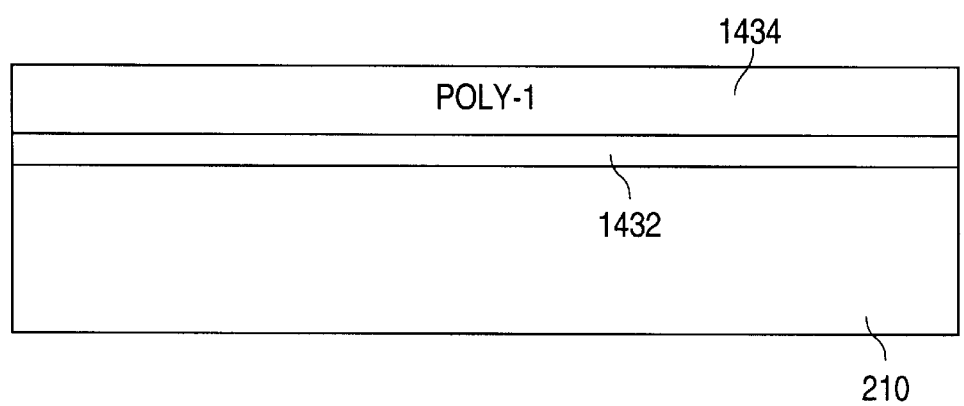
Figure 16A:
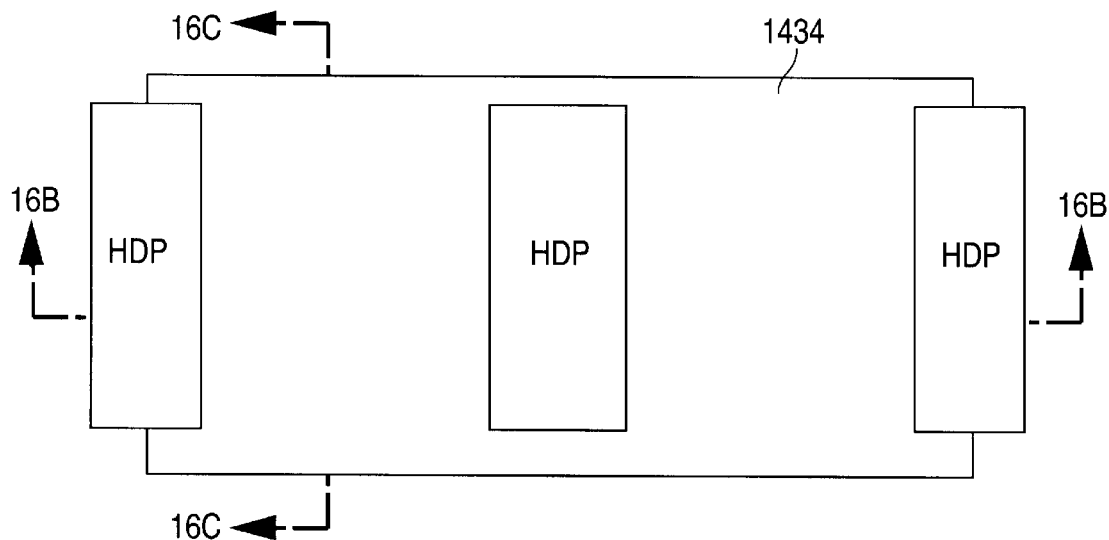
Figure 16B:
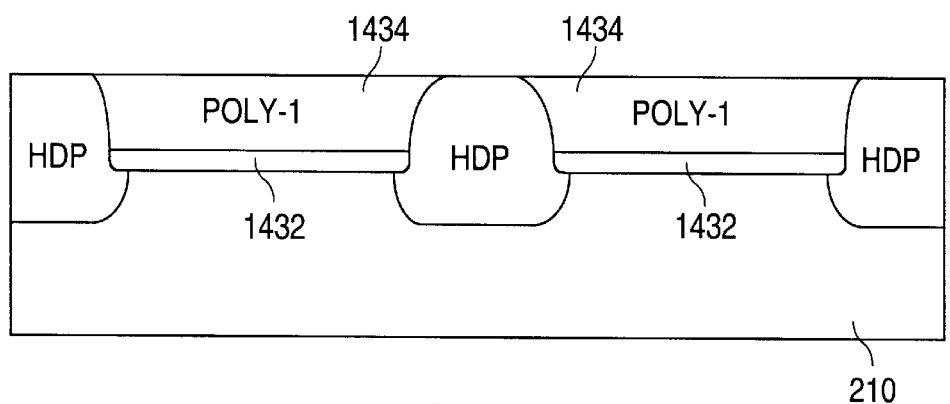
Figure 16C:
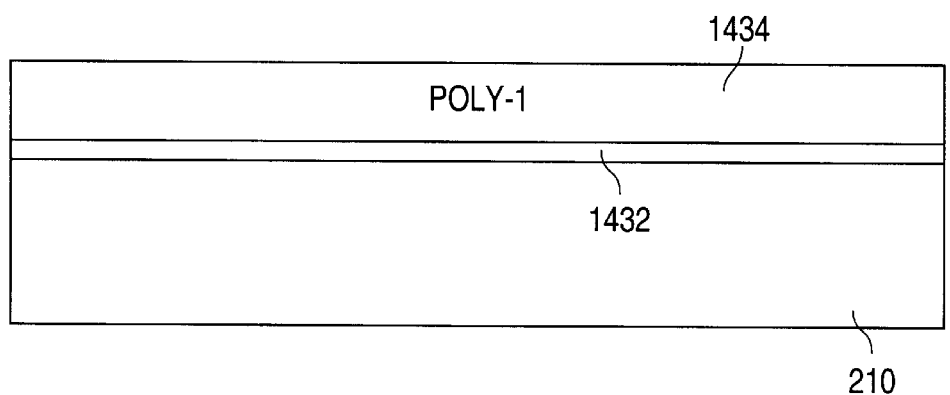

Next, as shown in FIGS. 15A–15C, a layer of tunnel oxide 1432 is formed on substrate material 210. Following this, a first layer of polysilicon (poly-1) 1434 is formed on tunnel oxide layer 1432 and the STI regions HDP. Next, in accordance with the present invention, as shown in FIGS. 16A–16C, poly-1 layer 1434 is planarized until poly-1 layer 1434 is removed from the top surfaces of the STI regions HDP. As discussed above, by planarizing poly-1 layer 1434, the length and position of the to-be-formed floating gates can be precisely controlled.

Figure 17A:
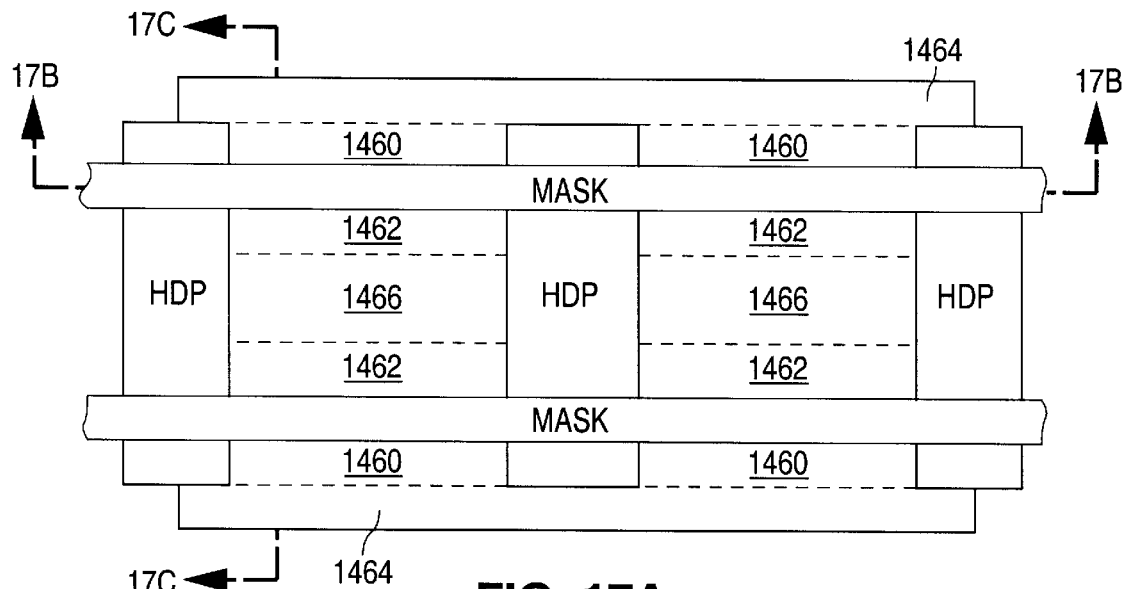
Figure 17B:
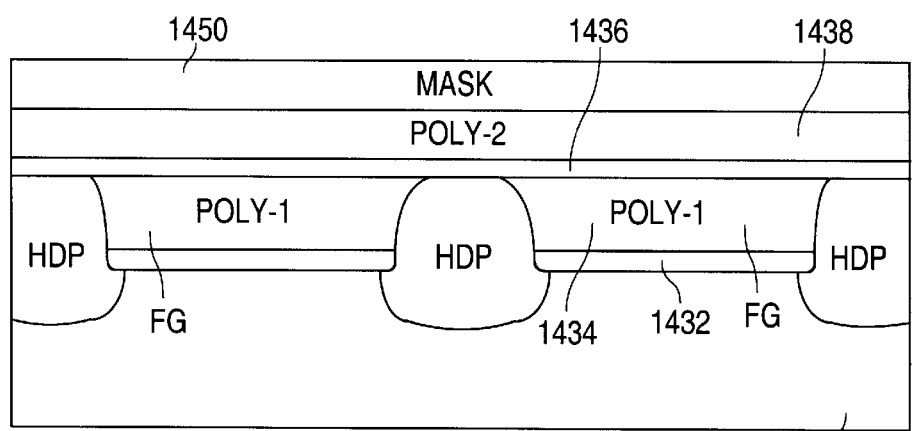
Figure 17C:
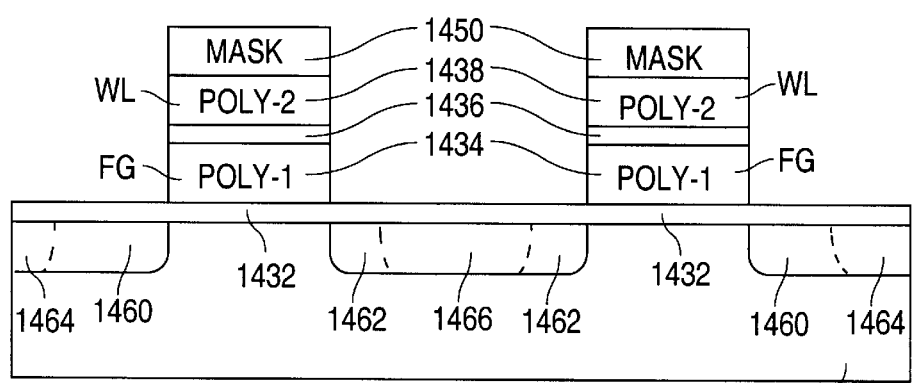

As shown in FIGS. 17A–17C, after the planarization has been completed, an oxide-nitride-oxide (ONO) layer 1436 is formed on poly-1 layer 1434 and the STI regions HDP, followed by the formation of a second layer of polysilicon (poly-2) 1438 on ONO layer 1436. Next, a word line mask 1450 is formed on poly-2 layer 1438. Word line mask 1450 is then patterned to define a number of strips on the surface of poly-2 layer 1438 that correspond with a number of to-be-formed word lines.

Once word line mask 1450 has been patterned, the exposed regions of poly-2 layer 1438 and underlying layers of ONO 1436 and poly-1 1434 are etched until the exposed regions of poly-1 layer 1434 are removed from the surface of tunnel oxide layer 1432. The etch of poly-2 layer 1438 defines a number of word lines WL, while the etch of poly-1 layer 1434 defines a number of floating gates FG. The etch also exposes regions of oxide layer 1432 that correspond with a number of to-be-formed source regions, a number of to-be-formed source lines, a number of to-be-formed drain regions, and a number of to-be-formed drain contact regions.

Following the etch, the exposed regions of oxide layer 1432 are implanted with a dopant, such as phosphorous or arsenic, to form a number of source regions 1460, a number of drain regions 1462, a number of source lines 1464, and a number of drain contact regions 1466 in semiconductor material 210. The source lines 1464 are formed so that each source region 1460 in a row of source regions 1460 is connected to a source line 1464. Following this, mask 1450 is removed, and the process continues with conventional steps.

Thus, the method of the present invention applies to the formation of floating gates which utilize STI isolation. As above, the misalignment error in the present invention is largely limited to estimating the amount of lateral etch that the side walls 224 of the STI regions HDP experience prior to the deposition of poly-1 layer 1434. As a result, the present invention largely eliminates the misalignment error.

Figure 18A:
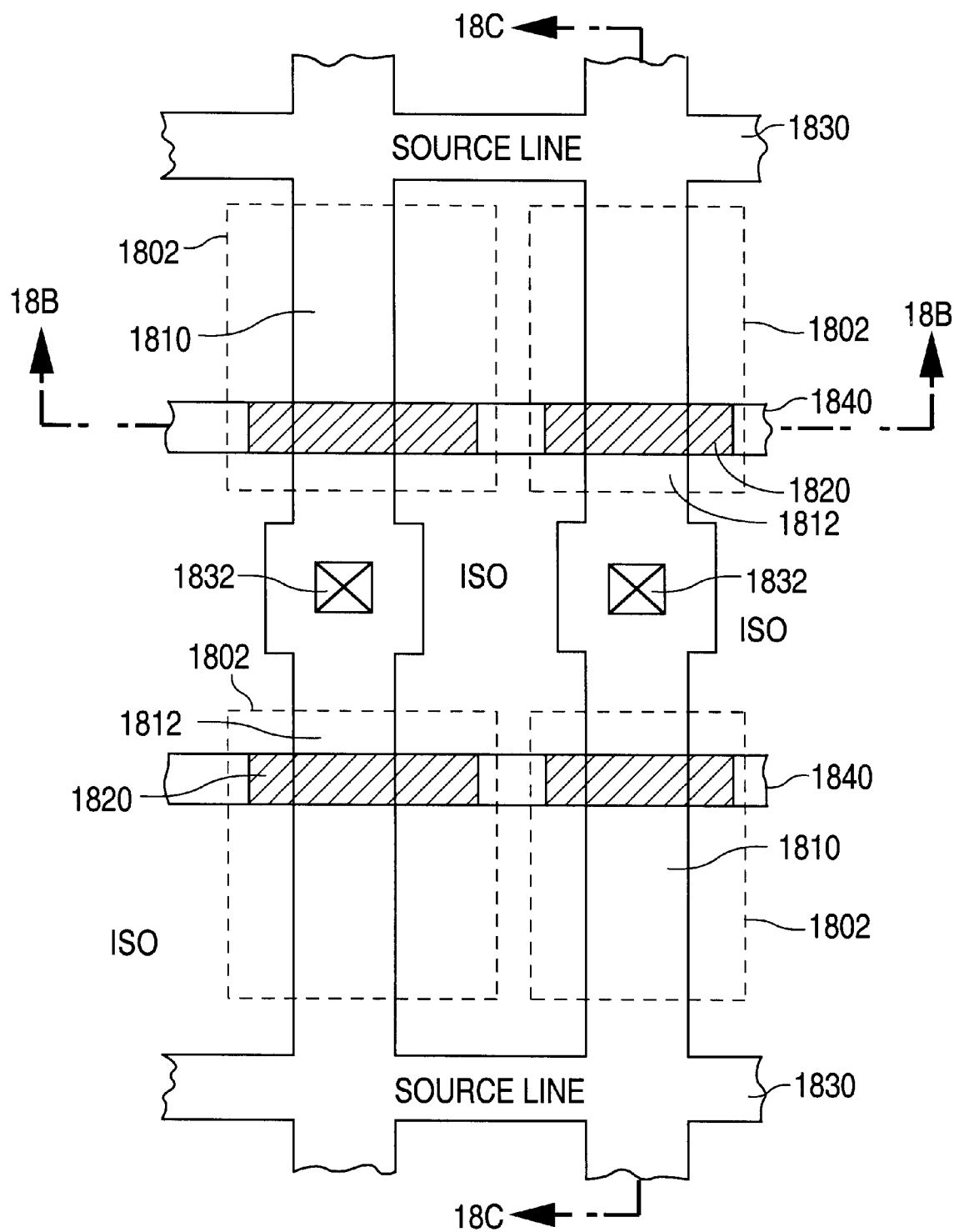
FIGS. 18A–18C are views illustrating a portion of a flash EPROM array 1800 that results from the steps of the present invention.
Figure 18B:
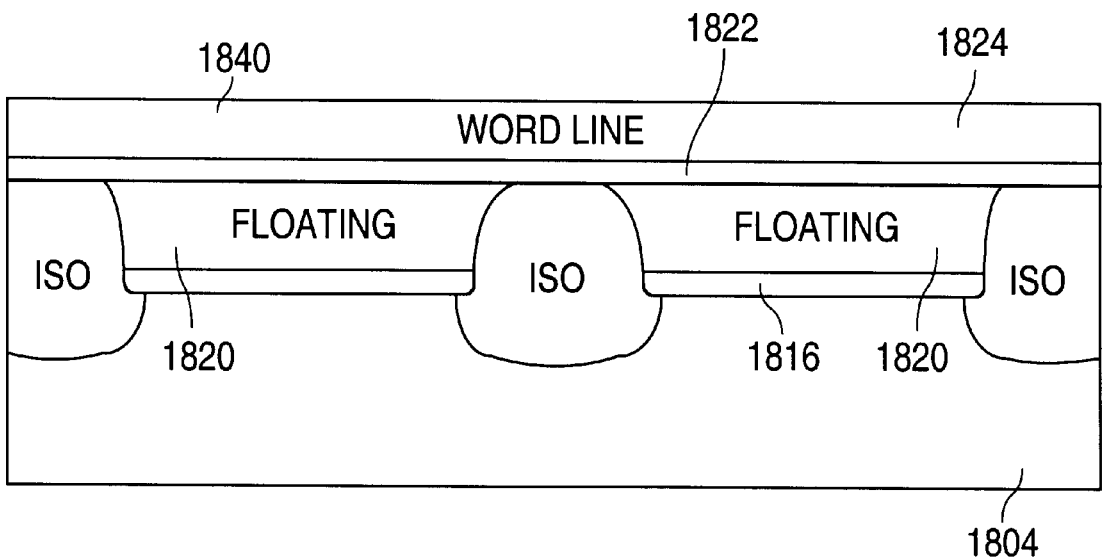
Figure 18C:
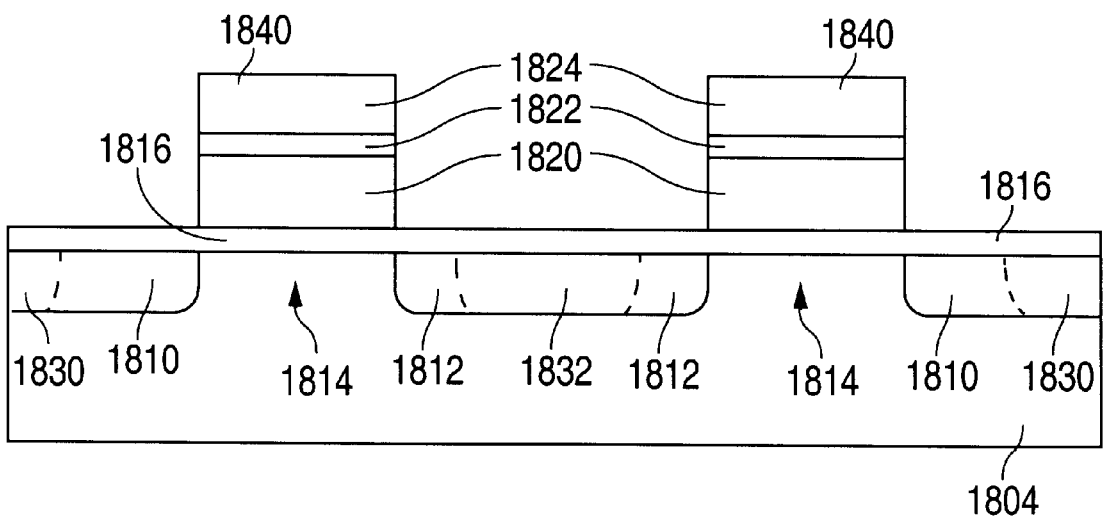

FIGS. 18A–18C show views that illustrate a portion of a flash EPROM array 1800 that results from the steps of the present invention. FIG. 18A shows a plan view, FIG. 18B shows a cross-sectional view taken along line 18B—18B of FIG. 18A, and FIG. 18C shows a cross-sectional view taken along line 18C—18C of FIG. 18A.

As shown in FIGS. 18A–18C, array 1800 includes a number of flash memory cells 1802 that are each formed in a p-type semiconductor material 1804. Each flash memory cell 1802 has spaced-apart n+source and drain regions 1810 and 1812 that are formed in material 1804, and a channel region 1814 that is defined between source and drain regions 1810 and 1812.

In addition, each flash memory cell 1802 also has a layer of tunnel oxide 1816 that is formed over channel region 1814, and a floating gate 1820 that is formed on tunnel oxide layer 1816. In accordance with the present invention, floating gates 1820 have substantially planar top surfaces. Further, each cell 1802 has a layer of interpoly dielectric 1822 that is formed on floating gate 1820, and a control gate 1824 that is formed on dielectric layer 1822.

As further shown in FIGS. 18A–138, array 1800 also includes a number of diffused source lines 1830 that are formed in semiconductor material 1804 so that each source region 1810 in a row of source regions is connected to a diffused source line 1830. Array 1800 further includes a number of bit line contact regions 1832 that are formed in semiconductor material 1804 so that each drain region 1812 is connected to a bit line contact region 1832. Array 1800 additionally includes a number of word lines 1840 which are formed so that each memory-transistor control gate 1824 in a row of memory-transistor control gates is connected to a word line 1840.

Array 1800 also includes a number of isolation regions ISO that are formed in semiconductor material 1804 to provide isolation between adjacent cells 1802 in the same row of cells. In accordance with the present invention, the isolation regions ISO have a substantially planar top surface that is substantially level with the top surfaces of floating gates 1820. The isolation regions ISO provide isolation from adjacent floating gates in the same row of floating gates.

Thus, the floating gates of flash memory cell 1800 have precisely defined lengths and positions. The only error that remains is the estimation of the amount of lateral etch that the side walls of the STI regions HDP experience.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a floating gate, the method comprising the steps of:

forming a number of trenches in a semiconductor material of a first conductivity type, the semiconductor material having a top surface, the step including:

forming a layer of pad oxide on the semiconductor material, the layer of pad oxide having a top surface, forming a layer of nitride on the layer of pad oxide, the layer of nitride having a top surface, etching the layer of nitride to form a number of exposed regions on the top surface of the layer of pad oxide, and etching the exposed regions of the layer of pad oxide and the semiconductor material to form the number of trenches in the semiconductor material;

forming a layer of isolation material in the trenches to fill up the trenches;

planarizing the layer of isolation material to form a number of isolation regions, the isolation regions having substantially planar top surfaces, the top surface of each isolation region lying above the top surface of the semiconductor material, the planarizing step including:

planarizing the layer of isolation material until the layer of isolation material is removed from the top surface of the layer of nitride to form the number of isolation regions, the top surfaces of the isolation regions being substantially level with the top surface of the layer of nitride, and removing the layer of nitride and the layer of pad oxide to form a number of exposed regions of the semiconductor material;

forming a first layer of dielectric material on the semiconductor material after the number of isolation regions have been formed, the step including:

forming a layer of gate oxide on the exposed regions of the semiconductor material, etching a number of tunnel window openings in the layer of gate oxide to form a number of exposed regions, and growing a layer of tunnel oxide on the number of exposed regions;

forming a first layer of conductive material over the first layer of dielectric material and the isolation regions; and planarizing the first layer of conductive material until the layer of first conductive material is removed from the top surfaces of the isolation regions, a heavily doped region of a second conductivity type being formed in the semiconductor material prior to the layer of gate oxide being formed.

2. The method of claim 1 wherein the layer of isolation material is planarized with methods that include chemical-mechanical polishing.

3. The method of claim 1 wherein the layer of conductive material is planarized with methods that include chemical-mechanical polishing.

4. The method of claim 1 and further comprising the steps of:

forming a second layer of dielectric material on the first conductive layer and the isolation regions after the first layer of conductive material has been planarized;

forming a second layer of conductive material on the second layer of dielectric material; and etching the second layer of conductive material, the second layer of dielectric material, and the first layer of conductive material.

5. The method of claim 4 and further comprising the step of implanting the semiconductor material to form source and drain regions after the second layer of conductive material has been etched.

6. A method for forming a floating gate, the method comprising the steps of:

forming a plurality of spaced-apart trench isolation regions in a semiconductor material of a first conductivity type, the semiconductor material having a top surface, the trench isolation regions having a top surface that lies above the top surface of the semiconductor material;

forming a doped region of a second conductivity type in the semiconductor material between an adjacent pair of trench isolation regions;

forming a first layer of dielectric material on the semiconductor material after the doped region has been formed;

forming a first layer of conductive material over the first layer of dielectric material and the trench isolation regions;

planarizing the first layer of conductive material until the layer of first conductive material is removed from the top surfaces of the trench isolation regions; and forming spaced-apart source and drain regions of the second conductivity type in the semiconductor material between the adjacent pair of trench isolation regions, the doped region being between the source and drain regions, the source region contacting the adjacent pair of trench isolation regions.

7. The method of claim 6 wherein the doped region, the source region, and the drain region have substantially an equivalent dopant concentration.

* * * * *